US012247923B2

(12) United States Patent
Robinson et al.

(10) Patent No.: US 12,247,923 B2
(45) Date of Patent: Mar. 11, 2025

(54) GRAPHENE HYBRIDS FOR BIOLOGICAL AND CHEMICAL SENSING

(71) Applicant: The Penn State Research Foundation, University Park, PA (US)

(72) Inventors: Joshua A. Robinson, State College, PA (US); Natalie Briggs, Benton City, WA (US); Kenneth Knappenberger, State College, PA (US); Tian Zhao, State College, PA (US)

(73) Assignee: THE PENN STATE RESEARCH FOUNDATION, University Park, PA (US)

( * ) Notice: Subject to any disclaimer, the term of this patent is extended or adjusted under 35 U.S.C. 154(b) by 554 days.

(21) Appl. No.: 17/594,595

(22) PCT Filed: Apr. 21, 2020

(86) PCT No.: PCT/US2020/029127
§ 371 (c)(1),
(2) Date: Oct. 22, 2021

(87) PCT Pub. No.: WO2020/219454
PCT Pub. Date: Oct. 29, 2020

(65) Prior Publication Data
US 2022/0178831 A1 Jun. 9, 2022

Related U.S. Application Data

(60) Provisional application No. 62/838,526, filed on Apr. 25, 2019.

(51) Int. Cl.
| | |
|---|---|
| C30B 29/68 | (2006.01) |
| C30B 23/02 | (2006.01) |
| C30B 25/18 | (2006.01) |
| C30B 29/06 | (2006.01) |
| C30B 29/46 | (2006.01) |

(Continued)

(52) U.S. Cl.
CPC ......... *G01N 21/658* (2013.01); *C30B 23/025* (2013.01); *C30B 25/183* (2013.01);
(Continued)

(58) Field of Classification Search
CPC ..... C30B 23/025; C30B 25/183; C30B 29/06; C30B 29/46; C30B 29/68;
(Continued)

(56) References Cited

U.S. PATENT DOCUMENTS 9,825,182 B2 * 11/2017 Jeon ................ H01L 21/02664
2009/0273779 A1 11/2009 Baumberg et al.
(Continued)

FOREIGN PATENT DOCUMENTS

WO 2009064347 A2 5/2009
WO 2014190331 A3 11/2014
(Continued)

OTHER PUBLICATIONS

Anderson et al."Intercalated Europium Metal in Epitaxial Graphene on SiC " arXiv:1710.07396v1 [cond-mat.mes-hall] Oct. 20, 2017.*
(Continued)

*Primary Examiner* — Robert M Kunemund
(74) *Attorney, Agent, or Firm* — Buchanan Ingersoll & Rooney PC

(57) ABSTRACT

Embodiments relate to a layered material (having a substrate, at least a buffer layer, with zero or more growth layers) that has been intercalated via a process that decouples (physically and electronically) the buffer layer from the substrate, thereby resulting in the creation of few-atom thick metal layers that exhibit a range of optical properties, including plasmonic or electronic resonance, that enables superior optical (e.g. Raman) detection of molecules.

12 Claims, 27 Drawing Sheets

(51) Int. Cl.
  *G01N 21/65* (2006.01)
  *H01L 21/02* (2006.01)
  *H01L 29/16* (2006.01)
(52) U.S. Cl.
  CPC .............. *C30B 29/06* (2013.01); *C30B 29/46*
        (2013.01); *C30B 29/68* (2013.01); *H01L*
            *21/02378* (2013.01); *H01L 21/02499*
        (2013.01); *H01L 21/02527* (2013.01); *H01L*
            *21/02532* (2013.01); *H01L 21/02631*
        (2013.01); *H01L 21/02694* (2013.01); *H01L*
          *29/1606* (2013.01); *G01N 2201/06113*
                                                (2013.01)
(58) Field of Classification Search
  CPC ........ G01N 2201/06113; G01N 21/658; H01L
              21/02378; H01L 21/02499; H01L
              21/02527; H01L 21/02532; H01L
              21/02631; H01L 29/1606
  See application file for complete search history.

(56) References Cited

U.S. PATENT DOCUMENTS

| | | | |
|---|---|---|---|
| 2012/0107958 A1 | 5/2012 | Poponin | |
| 2012/0141799 A1* | 6/2012 | Kub | ..................... H01L 31/072 |
| | | | 977/734 |
| 2013/0126865 A1 | 5/2013 | Chiang et al. | |
| 2014/0225066 A1* | 8/2014 | Weber | ................. H01L 27/0629 |
| | | | 257/532 |
| 2014/0327838 A1 | 11/2014 | Li et al. | |
| 2015/0083206 A1 | 3/2015 | Novoselov et al. | |
| 2017/0103826 A1* | 4/2017 | Al-Harthi | .............. H01B 3/004 |

FOREIGN PATENT DOCUMENTS

| | | |
|---|---|---|
| WO | 2017214512 A1 | 12/2017 |
| WO | 2018232393 A1 | 12/2018 |

OTHER PUBLICATIONS

Gao et al "Atomic-Scale Morphology and Electronic Structure of Manganese Atomic Layers Underneath Epitaxial Graphene on SiC (0001)" ACS NANo vol. 6 No. 8, 6562-6568 2012.*

Pillai et al "Decoupling of epitaxial graphene via gold intercalation probed by dispersive Raman spectroscopy " Journal of Applied Physcis vol. 117 paper 183103 2015.*

International Search Report and Written Opinion for PCT/US2020/029127 dated Jul. 24, 2020.

International Preliminary Report on Patentability for PCT US2020/029127 dated Sep. 28, 2021.

* cited by examiner

BEST AVAILABLE IMAGE    FIG. 17

GRAPHENE HYBRIDS FOR BIOLOGICAL AND CHEMICAL SENSING

CROSS-REFERENCE TO RELATED APPLICATIONS

This application is a U.S. national stage application under 35 U S C. § 371 for International Patent Application No. PCT/US2020/029127, filed on Apr. 21, 2020, which is related to and claims the benefit of U.S. Provisional Application No. 62/838,526, filed Apr. 25, 2019, the entire contents of which are incorporated herein by reference.

STATEMENT REGARDING FEDERALLY SPONSORED RESEARCH OR DEVELOPMENT

This invention was made with government support under Grant Nos. DMR1453924 and DMR1539916 awarded by the National Science Foundation, and under Grant No. FA9550-18-1-0347 awarded by the United States Air Force/AFOSR. The Government has certain rights in the invention.

FIELD OF THE INVENTION

Embodiments relate to a layered material having a substrate and a buffer layer (some embodiments also include at least one growth layer in addition to the buffer layer) that has been intercalated via a process that decouples (physically and electronically) the buffer layer from the substrate, thereby resulting in improved control of doping of overlaying growth layers. Decoupling can also enhance certain material properties of the layered material, such as plasmonic or electronic resonant properties for example.

BACKGROUND OF THE INVENTION

Intercalation is a process by which guest species or intercalant (e.g., atoms, ions, or molecules) are inserted between layers of a host material, where the insertion of such guest species can alter the properties of the host material. Generally, intercalation expands the van der Waals gap between layers of the host material, which requires energy. Layered host materials can have their material properties be engineered via intercalation to generate sensors, electrodes, switches, smart materials, etc. Conventional systems tend to rely on the use of halides, alkali earth, etc. as guest species. Use of conventional processes tend to lead to non-uniform guest species, leading to poor reproducibility in results. In addition, conventional systems tend to exploit the characteristics of the host material, as opposed to the characteristics of the intercalant and intercalant layers.

BRIEF SUMMARY OF THE INVENTION

Embodiments relate to a layered material (having a substrate and a buffer layer) that has been intercalated via a process that decouples (physically and electronically) the buffer layer from the substrate, thereby resulting in improved control of doping of overlaying growth layers. Decoupling can also enhance certain material properties of the layered material, such as plasmonic properties for example.

Some embodiments of the layered material can have a substrate and a buffer layer. The process can involve synthesis of a substrate to generate the buffer layer, the combined substrate and buffer layer forming a host material. The buffer layer can be an electrically inactive layer.

Some embodiments of the layered material can have a substrate, a buffer layer, and at least one growth layer. The process can involve synthesis of a substrate to generate growth layers, the combined substrate and growth layers forming a host material. The layer between the substrate surface and the first growth layer can be the buffer layer (an electrically inactive layer).

The process can involve defect engineering portions of the growth layers, which can be done via masking and etching or implantation. It should be noted that some growth layers can already have naturally formed defects.

The process can involve intercalation (e.g., via thermal evaporation for example) of intercalant (e.g., atoms, ions, or molecules) into the buffer layer, which may involve intercalation of intercalant through the growth layers and into the buffer layer. With embodiments having growth layers, the intercalant can migrate through the defect portions in the growth layers. The intercalation of intercalant into the buffer layer can: 1) decouple the buffer layer from the substrate layer; 2) cause the buffer layer to convert into a growth layer (or an additional growth layer if the host material already has growth layers formed thereon) as a result of the decoupling; and 3) form an interface layer (a layer between the substrate and the converted buffer layer) comprising the intercalant, which is pristine (free of defects, oxidation, and unwanted materials) and passivated by the converted buffer layer. In some embodiments, the interface layer can be a 2-dimensional (2-D) layer. In a 2-D layer configuration, the interface layer is less than 10 atoms thick, 10 ions thick, or 10 molecules thick. While the interface layer can be less than 10 atoms/ions/molecules thick, it is contemplated for the interface layer to be less than 5 atoms/ions/molecules thick. Having the interface layer being less than 5 atoms thick, 5 ions thick, or 5 molecules thick can result in a more stable structure.

The process can involve intercalation through defects that are native (naturally formed) to the host material and/or through defects that have been intentionally created via masking and etching or implantation.

Some embodiments can include forming a layered material having a heterostructure. One way to achieve this can be forming at least one growth layer (e.g., a supplemental growth layer) that differs from one or more previously formed growth layers (e.g., the primary growth layer(s)). For example, one embodiment involves forming a transition metal dichalcogenide (TMD) layer (a supplemental growth layer) on top of graphene (primary growth layer). Embodiments of the layered material having a heterostructure can facilitate coupling of excitons in the TMD layer with plasmons in the interface layer, resulting in a layered material that exhibits enhanced energy transfer properties. Another way to form a heterostructure can involve confining a species (atom, ion, or molecule) between two growth layers. For instance, a growth layer-A can be formed on a substrate-A, forming layered material-A. A growth layer-B can be formed on a substrate-B, forming layered material-B. A species (e.g., element, ion, molecule) can be positioned between growth layer-A and growth layer-B, where heat and pressure can be applied to cause layered material-A and layered material-B to advance towards each other to generate a layered heterostructure.

As noted herein, embodiments of the layered material and method of making and using the same can generate a resultant material with enhanced material properties. These properties can include plasmonic or electronic resonant (providing the ability to use surface plasmons to provide desired optical properties, such as negative real permittivity, etc.) and/or energy transfer properties. Enhanced plasmonic or electronic resonant properties can facilitate the use of the layered material as part of a sensor system, for example. A sensor system using an embodiment of the layered material structured as a plasmonic or electronic resonant material can be configured so that interaction of light with species-dielectric (or intercalant-dielectric) materials of the plasmonic or electronic resonant material generates plasmons.

Use of embodiments of the layered material in sensor systems can facilitate generation of a sensor with significantly improved sensitivity. For example, an embodiment of the layered material has been shown to exhibit greater than a 20× improvement in second harmonic generation and greater than a 1,000× improvement in non-linear susceptibility compared to conventional sensor systems.

In on embodiment, a plasmonic or electronically resonant material includes: a substrate; and an epitaxial growth layer comprising a graphene layer; and an interface layer formed between the graphene layer and the substrate, the interface layer comprising graphene passivated with intercalant.

In some embodiments, the graphene layer comprises a plurality of pristine graphene layers.

In some embodiments, the substrate is silicon carbide.

In some embodiments, the intercalant is metal.

In some embodiments, the intercalant comprises any one or combination of europium, hydrogen, silicon, gallium, indium, lithium, sodium, calcium, iron, palladium, platinum, gold, silver, germanium, tin, lead, oxygen, and fluorine.

In some embodiments, the material further includes at least one vapor deposition growth layer formed on top of the graphene layer.

In some embodiments, the at least one vapor deposition growth layer is a transition metal dichalcogenide layer.

In an exemplary embodiment, a sensor system includes: a switch comprising a plasmonic or electronically resonant material, the plasmonic or electronically resonant material including: a substrate; and an epitaxial growth layer, comprising a graphene layer; and an interface layer formed between the graphene layer and the substrate, the interface layer comprising pristine graphene passivated with intercalant; wherein plasmons are generated in the interface layer when light is incident upon the plasmonic or electronically resonant material; and wherein the incident light couples with the plasmons to form surface plasmon polaritons (SPPs); and a detector configured to detect the SPPs.

In some embodiments, the plasmonic or electronically resonant material further comprises at least one vapor deposition growth layer formed on top of the graphene layer.

In an exemplary embodiment, a sensor system for Raman spectroscopy includes: a plasmonic or electronically resonant material including: a substrate; an epitaxial growth layer, comprising a graphene layer; and an interface layer formed between the graphene layer and the substrate, the interface layer comprising pristine graphene passivated with intercalant; wherein plasmons are generated in the interface layer when light is incident upon the plasmonic or electronically resonant material, the light being electromagnetic radiation emitted from a sample due to Raman scattering interactions induced in the sample; and wherein the incident light couples with the plasmons to form surface plasmon polaritons (SPPs); and a detector configured to detect the SPPs.

In an exemplary embodiment, a compressed heterostructure plasmonic or electronically resonant material includes: a first substrate having a graphene layer formed thereon; a second substrate; and a metallic species disposed between the graphene layer and the second substrate; wherein the first substrate and second substrate are compressed under heat and pressure to form a layered heterostructure.

In some embodiments, the second substrate has a graphene layer formed thereon; and the metallic species is disposed between the graphene layer of the first substrate and the graphene layer of the second substrate.

In an exemplary embodiment, a method for forming a plasmonic or electronically resonant material involves: generating a plurality of epitaxial growth layers on a substrate, the plurality of epitaxial growth layers comprising: a buffer layer adjacent the substrate, the buffer layer being an electrically inactive layer, the buffer layer being partially bonded via covalent bonding to the substrate; a growth layer adjacent the buffer layer, the growth layer being an electrically active layer; intercalating the buffer layer with intercalant by allowing the intercalant to migrate through a plurality of defects in the growth layer and into the buffer layer, wherein the intercalate physically and electronically decouples the buffer layer from the substrate.

In some embodiments the method further involves generating the plurality of defects in the growth layer.

In an exemplary embodiment, a method for forming a plasmonic or electronically resonant material involves: generating an epitaxial growth layer on a substrate, the epitaxial growth layer comprising a buffer layer adjacent the substrate, the buffer layer being an electrically inactive layer, the buffer layer being partially bonded via covalent bonding to the substrate; and intercalating the buffer layer with intercalant to physically and electronically decouple the buffer layer from the substrate.

In some embodiments, the substrate is silicon carbide, and generating the plurality of epitaxial growth layers comprises silicon sublimation; and the plurality of epitaxial growth layers comprises graphene.

In some embodiments, the substrate is silicon carbide, and generating the epitaxial growth layer comprises silicon sublimation; and the epitaxial growth layer comprises graphene.

In some embodiments, generating the plurality of epitaxial growth layers comprises sublimation; generating the plurality of defects in the growth layer comprises masking and implantation; and intercalation comprises thermal evaporation.

In some embodiments, generating the epitaxial growth layer comprises sublimation; and intercalation comprises thermal evaporation.

In an exemplary embodiment, a Raman spectrometer includes: a light source configured to generate light that will be incident upon a sample; a detector configured to detect electromagnetic radiation generated by the sample; a plasmonic or electronically resonant material upon which the sample is placed, the plasmonic or electronically resonant material comprising: a substrate; an epitaxial growth layer, comprising a graphene layer; and an interface layer formed between the graphene layer and the substrate, the interface layer comprising pristine graphene passivated with intercalant; wherein: when the laser light interacts with the sample, molecules of the sample are excited so that molecular vibrations are generated; an electronic resonance is generated in the interface layer when the molecular vibrations occur; and the molecular vibrations couple with the electronic resonance to enhance the electromagnetic radiation emitted from the sample.

Further features, aspects, objects, advantages, and possible applications of the present invention will become apparent from a study of the exemplary embodiments and examples described below, in combination with the Figures, and the appended claims.

BRIEF DESCRIPTION OF THE FIGURES

The above and other objects, aspects, features, advantages and possible applications of the present invention will be more apparent from the following more particular description thereof, presented in conjunction with the following drawings. It should be understood that like reference numbers used in the drawings may identify like components.

DETAILED DESCRIPTION OF THE INVENTION

The following description is of an embodiment presently contemplated for carrying out the present invention. This description is not to be taken in a limiting sense, but is made merely for the purpose of describing the general principles and features of the present invention. The scope of the present invention should be determined with reference to the claims.

Figure 1:
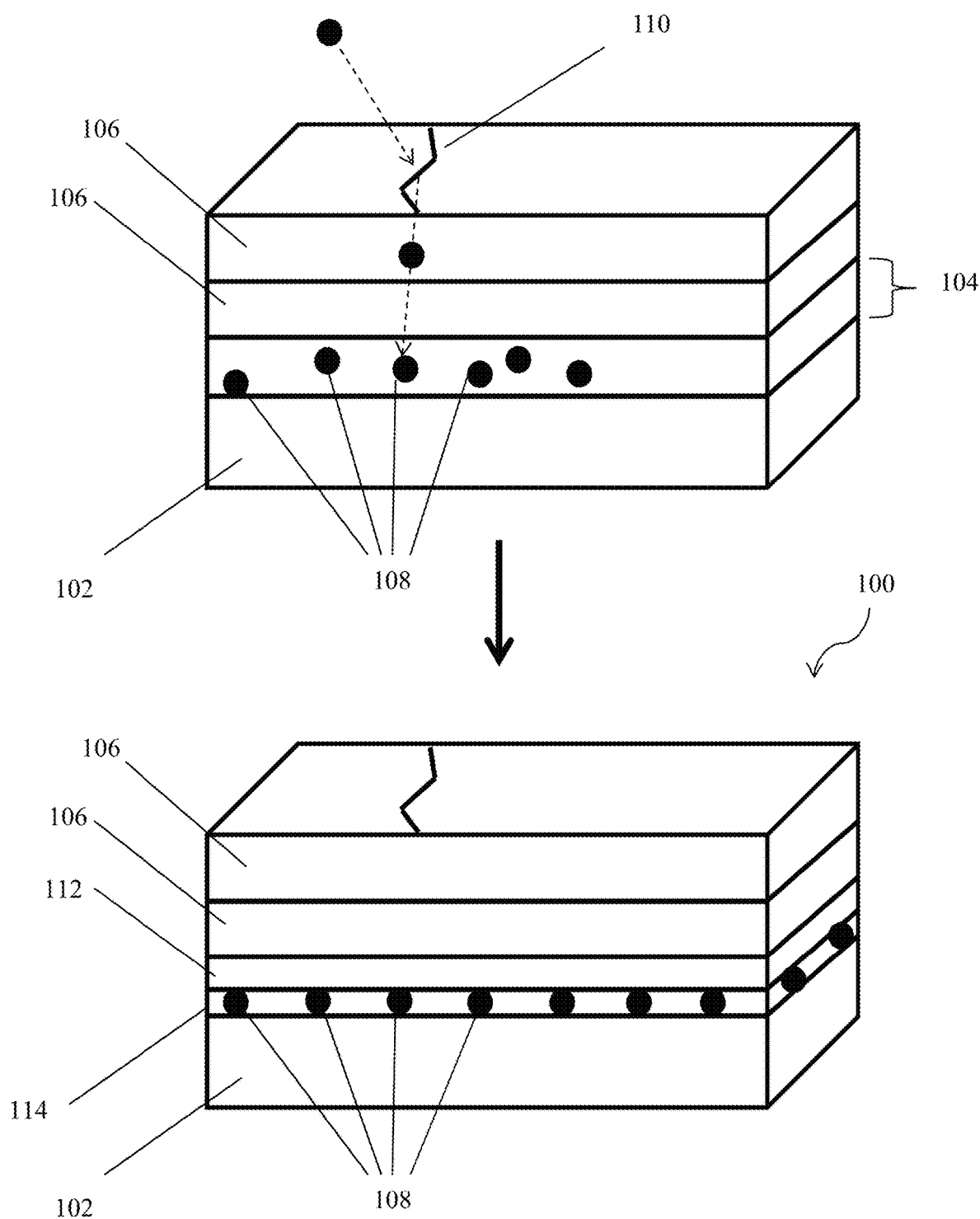
FIG. 1 is an exemplary schematic of an exemplary layered structure for an embodiment of the layered material.
Figure 2:
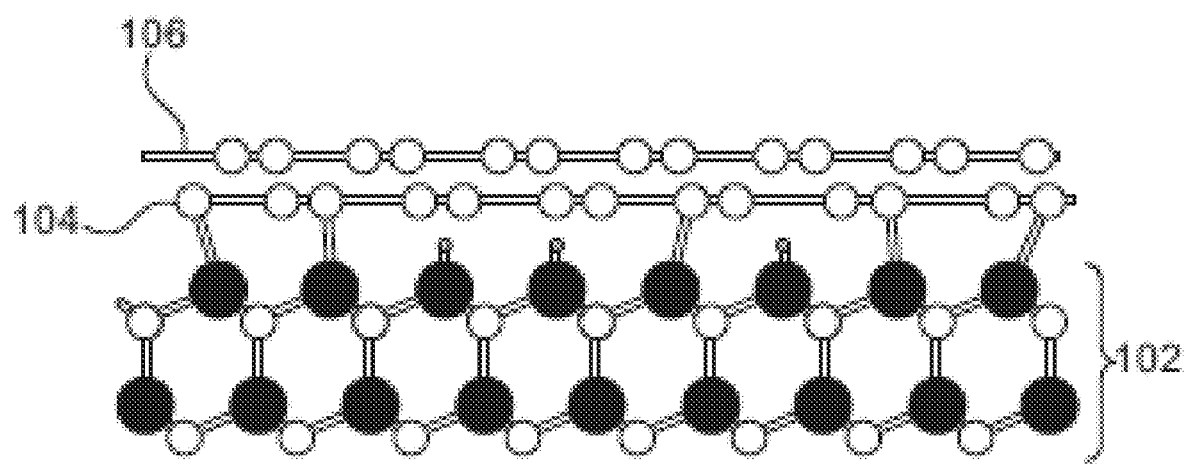
FIG. 2 shows an exemplary layered material structure before intercalation to decouple the buffer layer from the substrate.
Figure 3:
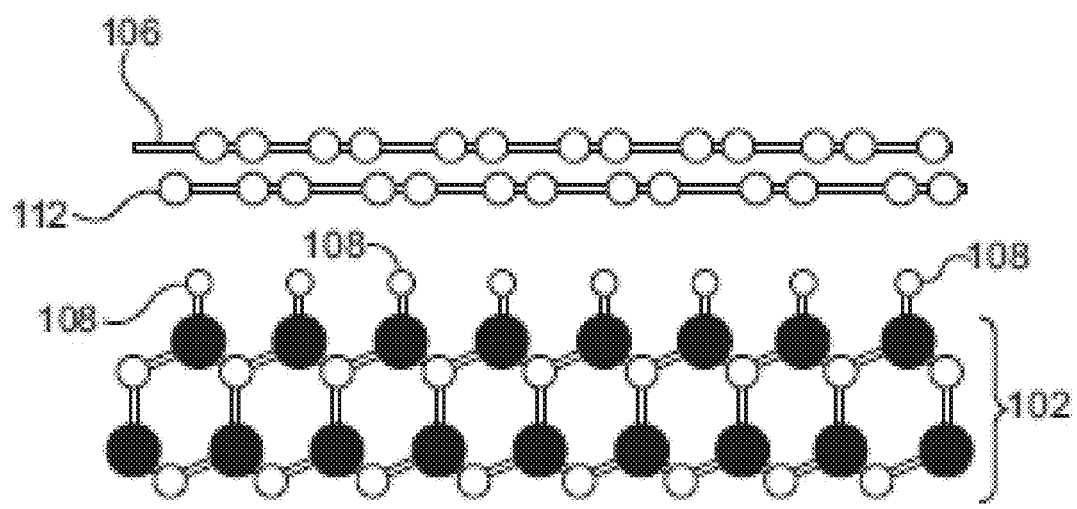
FIG. 3 shows an exemplary layered material structure after intercalation to decouple the buffer layer from the substrate.

Referring to FIGS. 1-3, embodiments can relate to a layered material 100 (having a substrate 102, a buffer layer 104 that has been intercalated via a process that decouples (physically and electronically) the buffer layer 104 from the substrate 102, thereby resulting in improved control of doping of overlaying growth layers 106. Decoupling can also enhance certain material properties (e.g., electrical, mechanical, optical, magnetic, physical, chemical, conductive, plasmonic or electronic resonant, etc.) of the layered material 100.

In some embodiments, the layered material 100 can have one or more growth layers 106 formed on top of the buffer layer 104. For instance, embodiments of the layered material 100 can include a substrate 102 from which at least one growth layer 106 is formed. For example, the substrate 102 can be silicon carbide (SiC). Growth layers 106 can be formed via epitaxial growth, for example, to form graphene growth layers 106. For instance, epitaxial growth can be performed to cause Si sublimation from the SiC, forming a graphene growth layer 106 on top of the substrate 102. The growth can form a plurality of growth layers 106. For instance, the layered material 100 can include a buffer layer 104, and a first growth layer 106 formed on top of the substrate 102, a second growth layer 106 formed on top of the first growth layer 106, a third growth layer 106 formed on top of the second growth layer 106, a fourth growth layer 106 formed on top of the third growth layer 106, etc.

It should be noted that other substrates 102 can be used to form graphene growth layers 106, and that growth layers 106 other than graphene growth layers 106 can be formed. For example, carbon may be deposited onto sapphire, copper, nickel, and most refractory metals to form a graphene layer that may act as a growth layer. Furthermore, non-graphene growth layers may include boron nitride (BN), transition metal dichalcogenides (TMDs), or any other layered structure capable of being deposited onto a substrate 102.

Some embodiments can include formation of a buffer layer 104 that lies between the first growth layer 106 and the substrate 102. With embodiments where the substrate 102 is SiC and the growth layers 106 are graphene, the buffer layer 104 can be an electrically inactive layer of carbon generated due to the high temperatures associated with the Si sublimation process. The buffer layer 104 may be partially bound to the substrate 102 (see FIG. 2). The buffer layer 104, due to its electrical inactivity, causes charge carrier scattering that reduces carrier mobility (i.e., the carrier mobility of the buffer layer 104 is below that of any of the growth layers 106). This reduction in carrier mobility can lead to degradation in plasmonic or electronic resonant properties, conductivity, and/or energy transfer if the layered material 100 were to be used as part of a sensor or electrode, for example, without using embodiments of the methods disclosed herein to decouple the buffer layer 104 from the substrate 102.

Some embodiments can include forming only the buffer layer 104 without any growth layers 106. Embodiments of the layered material without any growth layers 106 can be intercalated so that intercalant is caused to enter the buffer layer 104 and reside beneath the buffer layer 104. This can form an interface layer 114 of intercalant 108 that is between the substrate 102 and the buffer layer 104. As will be explained, once the buffer layer 104 is intercalated, it decouples from the substrate 102, thereby converting into a growth layer 106. With embodiments already having growth layers 106, intercalation causes the buffer layer 104 to convert into an additional growth layer 112 that resides between the interface layer 114 and the first growth layer 106.

Figure 27:
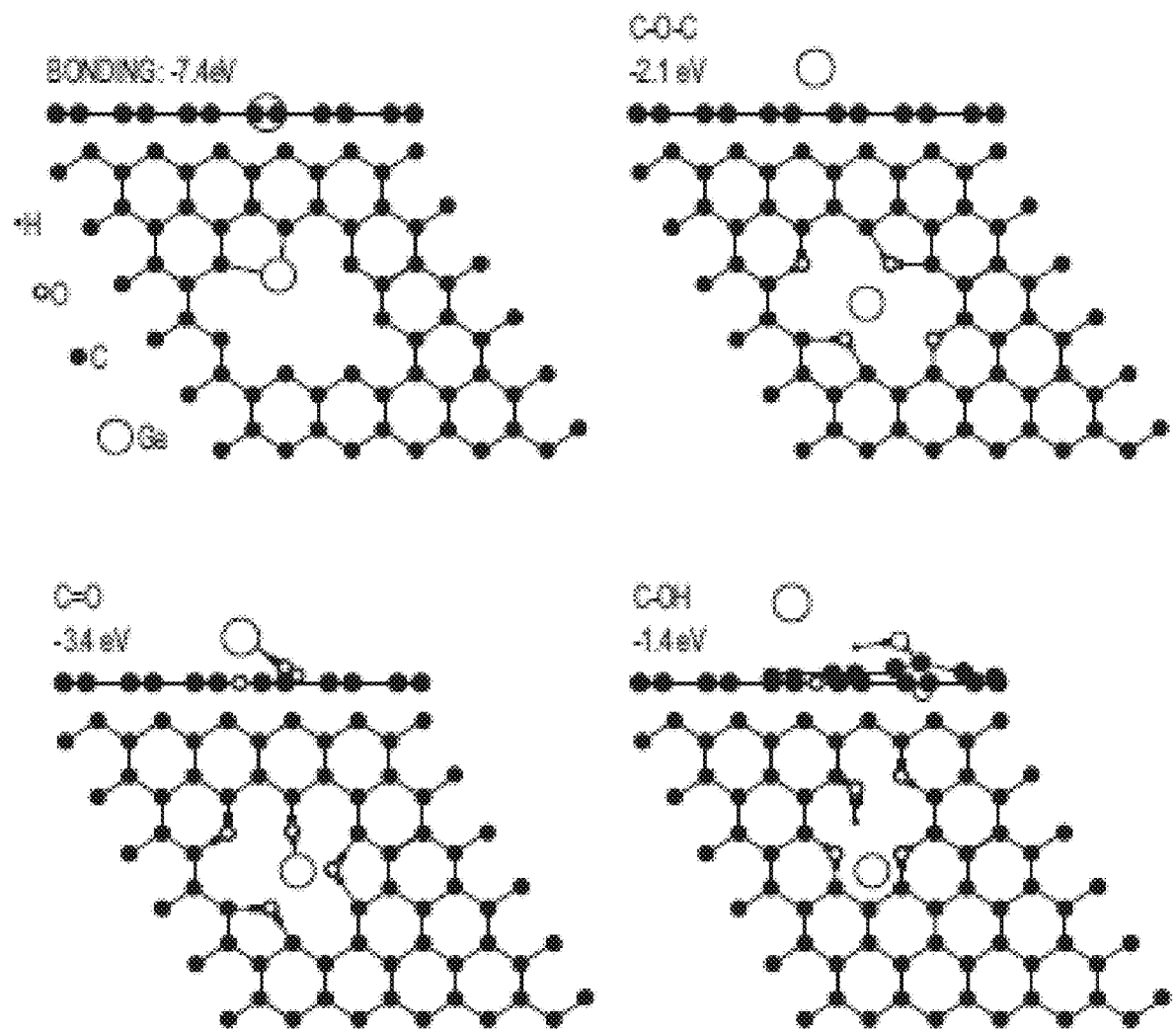
FIG. 27 shows exemplary defect formations in a lattice structure.

As noted above, other embodiments can include forming at least one growth layer 106 on top of the buffer layer 104 before intercalation occurs. With embodiments including at least one growth layer 106, intercalant can be made to migrate through defects in the growth layer(s) 106 via the intercalation process. Defects in the growth layer(s) 106 can be naturally occurring defects 110 or engineered defects 110 (see FIG. 27 for an exemplary defect formation in a lattice structure). A defect 110 can be anything (e.g., holes, grain boundaries, etc.) that disrupts the continuous layers of the growth layers 106. The defects 110 can allow for intercalant 108 (during the intercalation process) to migrate through the growth layers 106 and beneath the buffer layer 104 so as to reside between buffer layer 104 and substrate 102, as dictated by the defects 110. The intercalant 108 that migrates to the buffer layer 104 decouples the buffer layer 104 from the substrate 102. This can involve physically and/or electrically decoupling the buffer layer 104 from the substrate 102. Once the buffer layer 104 is intercalated with the intercalant 108, the buffer layer 104 is converted to an additional growth layer 112 located between the first growth layer 106 and the substrate 102.

The intercalant 108 residing between the converted buffer layer 104 (converted to a growth layer 106 or an additional growth layer 112) forms an interface layer 114 that lies between the substrate 102 and the converted buffer layer (the converted buffer layer now being the additional growth layer 112). The interface layer 114 is pristine (free of defects, oxidation, and unwanted materials) and is passivated by the converted buffer layer 104. In some embodiments, the interface layer 114 can be a 2-dimensional (2-D) layer that is less than five atoms thick, five ions thick, or five molecules thick.

In addition, intercalation can be performed on any one or combination of the growth layers 106. For instance, the intercalant 108 can be intercalated between the first growth layer 106 and the second growth layer 106, the intercalant 108 can be intercalated between the second growth layer 106 and the third growth layer 106, the intercalant 108 can be intercalated between the third growth layer 106 and the fourth growth layer 106, etc. The intercalant 108 between the buffer layer 104 and substrate 102 can be the same as or different from the intercalant 108 between any of the growth layers 106. The intercalant 108 between any two growth layers 106 can be the same as or different from the intercalant 108 between any other two growth layers 106.

The intercalant 108 between the buffer layer 104 and substrate 102 and/or between any two growth layers 106 can be homogenous or heterogenous. The intercalant 108 in or between a layer being homogenous means that all of the intercalant 108 within or between that layer is the same. The intercalant 108 in or between a layer being heterogenous means that the intercalant 108 within or between that layer is not the same. For instance, the buffer layer 104 (or an interlayer between two growth layers 106) can be intercalated with a first intercalant 108 and a second intercalant 108, wherein the first intercalant 108 differs from the second intercalant 108. For instance, the first intercalant 108 may be a group-III element (Ga, In, Al, etc) and the second intercalant 108 may be a group V element (N, As, Sb, etc.) or a group VI element (O, S, Se, Te). In another instance, the first intercalant 108 could be a transition metal (Fe, Nb, etc.) and the second intercalant 108 could be any element that reacts with the transition metal to form a transition metal compound.

Figure 4:
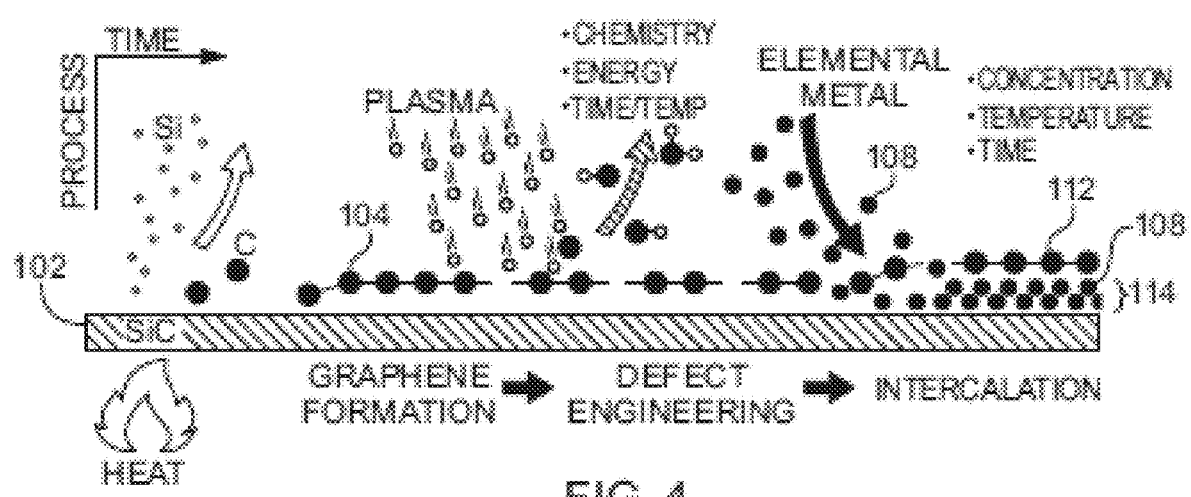
FIG. 4 shows an exemplary process that can be implemented to form an embodiment of the layered material of FIG. 3.

Referring to FIG. 4, a non-limiting exemplary process that can be implemented to form an embodiment of the layered material 100 will now be discussed. A substrate 102 can be formed by growth of single crystals of substrate material via the Lely method, for example. In other embodiments, other methods for growing single crystals for the substrate 102 can be used. With embodiments of the substrate 102 being SiC crystals, the process can involve use of on-axis (+/−0.5 degrees) hexagonal SiC wafers (6H or 4H).

The process can involve synthesis of growth layers 106, which may involve growth of a buffer layer 104 only, or a buffer layer 104 and at least one growth layer 106, on top of the substrate 102. This can be achieved via epitaxial growth or partial decomposition of the substrate 102. With the substrate being SiC, each growth layer 106 can be graphene. Each growth layer 106 can be a single carbon atom thick, forming a graphene sheet. For instance, decomposition of the SiC substrate 102 is used to cause Si sublimation from the substrate 102 so that C atoms generate a buffer layer 104 comprising graphene, or a buffer layer 104 and a growth layer 106 in which both comprise graphene. The buffer layer 104 can be adjacent the SiC substrate 102. The substrate surface decomposition can be used to subsequently generate growth layers 106. This can involve generating a second growth layer 106 in top of the first growth layer 106, generating a third growth layer 106 on top of the second growth layer 106, generating a fourth growth layer 106 on top of the third growth layer 106, etc. Embodiments of the synthesis process can be performed at pressures at least 1 Torr and temperatures at least 1200° C.

The epitaxial growth can involve high temperatures (within a range from 1200° C. to 2700° C.) to allow for Si sublimation from the SiC substrate 102 surface, and a subsequent 6√3×6√3)R30° reconstruction of carbon atoms. The reconstruction of carbon atoms form the growth layers 106. These high temperatures can cause the formation of an electrically inactive layer of carbon to form on the surface of the substrate 102. This can be referred to as a buffer layer 104. Thus, a buffer layer 104 can be formed on the substrate 102 between the surface of the substrate 102 and the first growth layer 106. The buffer layer 104 can be partially (approximately ⅓ of the carbon atoms of the buffer layer 104) bound to the SiC substrate 102 via covalent bonding (see FIG. 2). This partially covalently bonded layer can readily be passivated by various intercalants 108 due to the fact that ⅔ of the substrate 102 has high-energy dangling Si-bonds.

Figure 5:
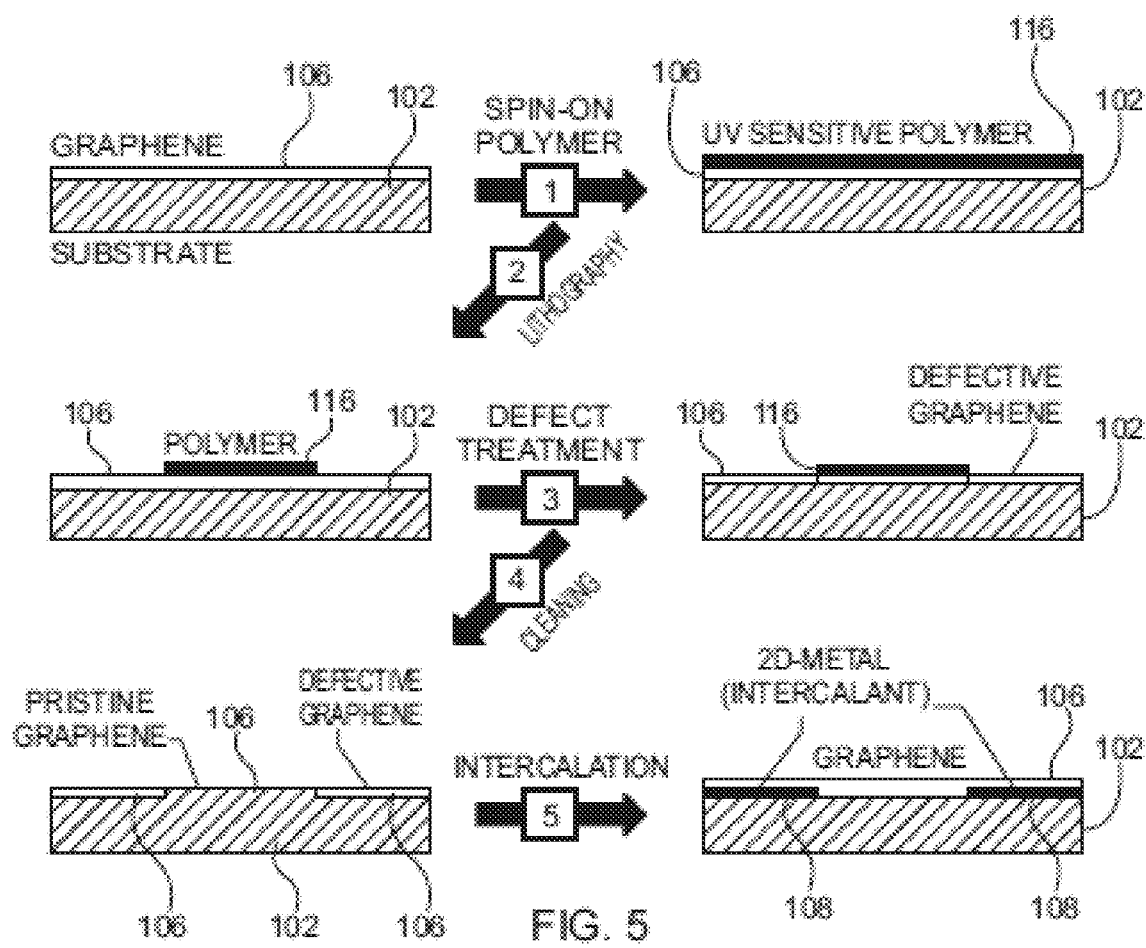
FIG. 5 shows an exemplary schematic of a process for selective area intercalation using defect engineering of pre-defined areas.

Referring to FIGS. 4-5, the process can involve defect engineering or formation of defects 110 in at least one of the growth layers 106. Defects 110 can be formed in any one or combination of the growth layers 106 and/or buffer layer 104 (defects 110 may be formed in the buffer layer 104 (both when there exists only the buffer layer 110 on the substrate, as well as where there exists a buffer layer 104 and growth layer(s) 106 on the substrate). As a non-limiting example, the top growth layer 106 can undergo masking (e.g., lithographic patterning, shadow masking, stencil masking, etc.) to generate predetermined patterns of defects 110 in any one or combination of growth layers 106. As a non-limiting example, a layered material 100 can include a substrate 102, a buffer layer 104, a first growth layer 106, a second growth layer 106, a third growth layer 106, and a fourth growth layer 106, the fourth growth layer 106 being the top growth layer 106. A patterned mask 116 (having patterned voids, photosensitive areas, etc.) can be applied to the fourth growth layer 106, wherein the mask 116 will protect the growth layers 106 from etching, implantation (chemical, ion, plasma, etc.), or other process but the patterned voids or sensitive areas in the mask 116 will not. The patterned voids or sensitive areas of the mask 116 will allow for defects to be generated in the growth layers 106 but the non-voided or non-sensitive area regions will prevent defects 110 from occurring in the growth layers 106. This can result in formation of defects 110 in the growth layers 106 in predetermined locations, in accordance with the mask pattern. A non-limiting example of a mask 116 can be a polymer with patterned photosensitive areas that is applied to the fourth layer 106, wherein photolithography is used to generate defects 110 in the growth layers 106. One embodiment can include masking and plasma treatment/etching. Plasmas used can include $O_2/He$, $N_2/H_2$, $CF_4/He$, etc.

The process can involve thermal evaporation, e-beam evaporation, metal organic chemical vapor deposition, molecular beam epitaxy, etc. of intercalant 108 to cause intercalation beneath the buffer layer 104. It is contemplated for the intercalant 108 to be metal (e.g., europium (Eu), gallium (Ga), indium (In), lithium (Li), sodium (Na), calcium (Ca), manganese (Mn), iron (Fe), palladium (Pd), platinum (Pt), gold (Au), silicon (Si), germanium (Ge), tin (Sn), lead (Pb), etc.), but other intercalant 108 can be used (e.g., hydrogen (H), oxygen (O), fluorine (F), silicon (Si), etc.). For instance, following plasma exposure for defect engineering, the growth layers 106 can be exposed to metal intercalant 108. The layered material 100 can then be placed in a furnace, which can be evacuated to ~10 mTorr and subsequently pressurized to 300-700 Torr (it should be noted that ultra-high vacuum ($10^{-9}$ Torr) environments may also be used to achieve intercalation, and thus intercalation at other pressures can be done) with 50 standard cubic centimeters per minute (sccm) Argon. The furnace can be heated to 600-1100° C. and held at temperature for 30 minutes. Use of metallic intercalant 108 precursors enables the realization of 2-D metal layers of intercalant 108 located in the buffer layer 104. During intercalation, intercalant 108 migrate through the defects 110 in the growth layers 106 and reside between the substrate and the buffer layer 104. With embodiments in which the host material has growth layers 104 before intercalation, the intercalation (via the decoupling) transforms the buffer layer 104 into an additional growth layer 112. Decoupling the buffer layer 104 from the substrate 102 can allow for control of material properties of the converted buffer layer 104, additional growth layer 112, or the growth layer(s) 106 via the intercalation of intercalant 108. For instance, the decoupling changes the doping levels of the layer(s) 104, 106, 112, and based on the intercalant 108, the doping of the layer(s) 104, 106, 112 can be tuned between being electron-rich (more electrons) and electron deficient (more holes). Thus, it can be tuned between being an n or p-type. The doping level may also be tuned via thickness or intercalant layer number.

Figure 6:
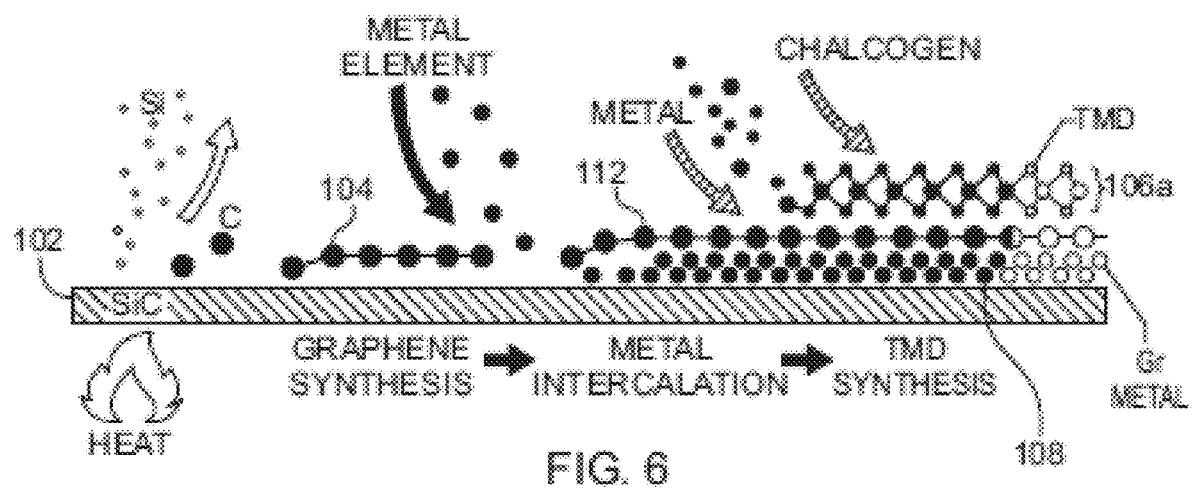
FIG. 6 shows an exemplary process that can be implemented to form an embodiment of the layered material having a heterostructure.

Referring to FIG. 6, some embodiments can include forming a layered material 100 having a heterostructure. One way to achieve this can be forming at least one growth layer 106 (e.g. a supplemental growth layer 106a) that differs from the growth layers 106 previously formed (e.g., the primary growth layers 106). The layered material 100 can include a plurality of supplemental growth layers 106a. For instance, the layered material 100 can include a first supplemental growth layer 106a, a second supplemental growth layer 106a, a third supplemental growth layer 106a, a fourth supplemental growth layer 106a, etc.

The primary growth layers 106 can be formed via a first growth process (e.g., Si sublimation). The supplemental growth layers 106a can be formed via a second growth process (e.g. vapor deposition). For instance, the layered material 100 can include the substrate 102 with a buffer layer 104 (a primary growth layer 106) and at least one growth layer 106 (a primary growth layer 106). The buffer layer 104 can be intercalated to generate an additional growth layer 112 (a primary growth layer 106) and an interface layer 114 (a primary growth layer 106). At least one supplemental growth layer 106a can be formed on top of any one or combination of the primary growth layers 106. For instance, a supplemental growth layer 106a can be formed on top of the additional growth layer 112 so as to be between the additional growth layer 106 (a primary growth layer 106) and the first growth layer 106 (a primary growth layer 106). Embodiments of the supplemental growth layer(s) 106a can include transition metal dichalcogenide (TMD) on top of a primary growth layer graphene 106, for example.

Embodiments of the layered material 100 having a heterostructure can facilitate coupling of excitons in the supplemental growth layer(s) 106a with plasmons in the interface layer 114, resulting in a layered material 100 that exhibits enhanced efficiency and interfacial energy transfer. For example, the layered material 100 can aid in exciton energy transfer by configuring an embodiment of the layered material 100 to generate plexcitons. Plexcitons are polaritonic modes generated from coherently coupled plasmons (a quantity of collective electron oscillations) and excitons (excited electrons bound to the hole produced by their excitation). Plexcitons can allow exciton energy transfer to reach distances of approximately 20,000 nanometers. Thus, embodiments of the layered material 100 can be used to generate plexcitonic devices that may be used to control nanoscale energy flows, for example.

A non-limiting exemplary process that can be implemented to form an embodiment of the layered material 100 having supplemental growth layers 106*a* will now be discussed. A SiC substrate 102 can be formed by any of the growth techniques disclosed herein to grow single crystals of substrate material. Synthesis of primary graphene growth layers 106 can be done via a first growth process (e.g., any of the growth techniques related to synthesis disclosed herein) to form at least one primary graphene growth layer 106 on the SiC substrate 102. Defect formation within the primary growth layers 106 can be done via any of the defect engineering techniques disclosed herein. Intercalation of the primary buffer layer 104 can be done via any of the intercalation techniques disclosed herein. The primary graphene growth layers 106 can include a primary buffer layer 104, a primary interface layer 114, a primary additional growth layer 106, and at least one primary growth layer 106 (e.g., a first primary growth layer 106, a second primary growth layer 106, a third primary growth layer 106, etc.). For instance, the layered material 100 can include: a substrate 102; a primary buffer layer 104 (comprising the primary interface layer 114 and the primary additional growth layer 106) adjacent the substrate 102; and a first primary growth layer 106 adjacent the buffer layer 104.

At least one supplemental growth layer 106*a* can be formed on the first primary growth layer 106 via a second growth process. It is contemplated for only one supplemental growth layer 106*a* to be formed so as to provide strong optical properties, but more than one supplemental growth layer 106*a* can be generated. The second growth process can be via vapor deposition. In a non-limiting example, the second growth process can be metal organic chemical vapor deposition (MOCVD) used to generate supplemental growth layer(s) 106*a* of having metal and chalcogen. For instance, MOCVD can be used to generate a transition metal dichalcogenide (TMD) layer as the supplemental growth layer 106*a*. Embodiments of the TMD can include, but not limited to, $MoS_2$, $WS_2$, $MoSe_2$, $WSe_2$. For instance, at least one 2-D $WSe_2$ supplemental growth layer 106*a* can be directly grown on the first primary growth layer 106 performed at 150° C. or higher using $W(CO)_6$ and $H_2Se$ as metal and chalcogen sources. The layered material 100 comprising of at least one primary growth layer 106 and supplemental growth layer 106*a* forms a heterogeneous structure.

Figure 7:
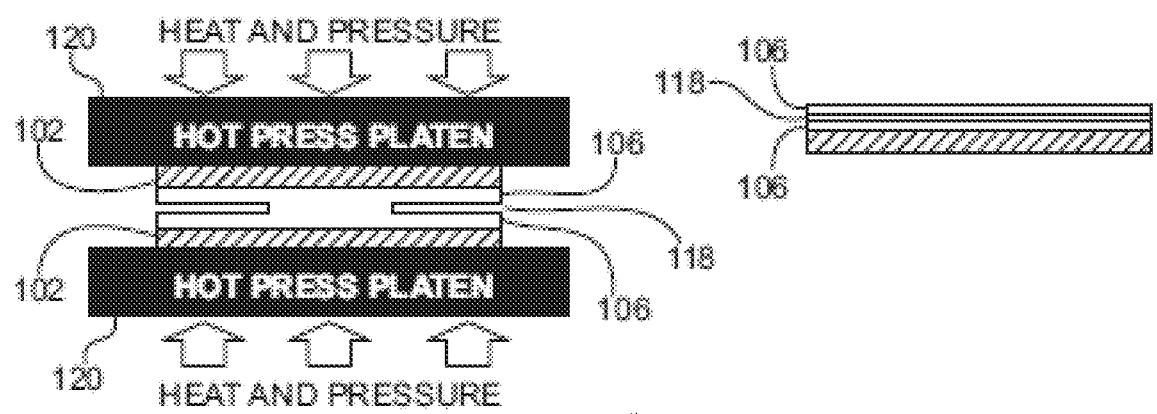
FIG. 7 shows an exemplary layered material structure being formed by an exemplary compression process.
Figure 8:
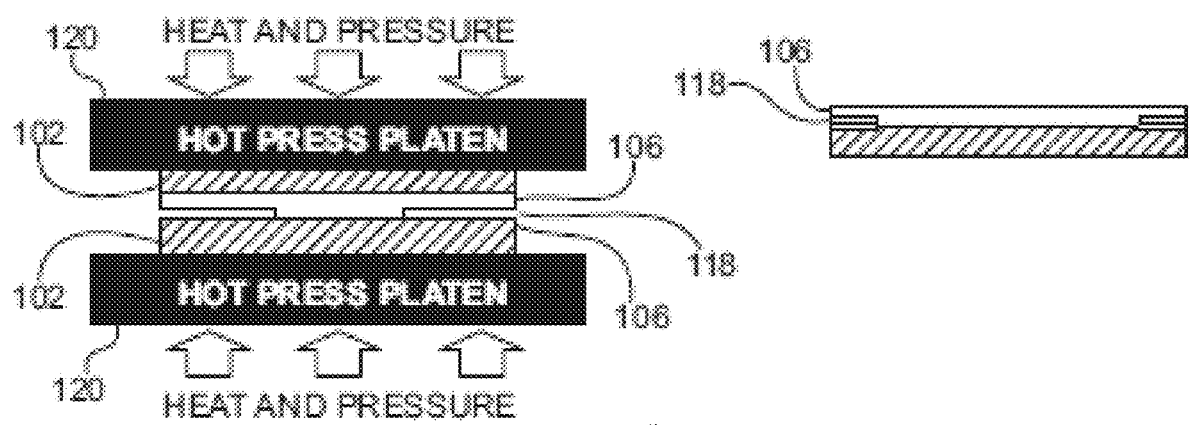
FIG. 8 shows another exemplary layered material structure being formed by an exemplary compression process.

Referring to FIGS. 7-8, another method of forming a layered material 100 having a heterostructure can involve confining a species 118 (atom, ion, or molecule) between two growth layers 106. For instance, a growth layer-A 106 can be formed on a substrate-A 102, forming layered material-A. A growth layer-B 106 can be formed on a substrate-B 102, forming layered material-B. Growth layer-A 106 and/or growth layer-B 106 can be formed via any of the growth methods disclosed herein (e.g., Si sublimation, vapor deposition, etc.). Growth layer-A 106 and/or growth layer-B 106 can be a graphene layer, a TMD layer, etc. A species 118 can be positioned between growth layer-A 106 and growth layer-B 106. Heat and pressure can be applied to cause layered material-A and layered material-B to advance towards each other to generate a layered material heterostructure. For instance, the layered material 100 can include a compressed composite comprising: substrate-A 102 being adjacent growth layer-A 106; growth layer-A 106 being adjacent species 118; species being adjacent growth layer-B 106; and growth layer-B 106 being adjacent substrate-B 102. This can form a layered material 100 that has a graphene/species/graphene layered structure.

As another example, a growth layer-A 106 can be formed on a substrate-A 102, forming layered material-A. A substrate-B 102 can be formed. A species 118 can be positioned between growth layer-A 106 and substrate-B 102. Heat and pressure can be applied to cause layered material-A and substrate-B 102 to advance towards each other to generate a layered material heterostructure. For instance, the layered material 100 can include a compressed composite comprising: substrate-A 102 being adjacent growth layer-A 106; growth layer-A 106 being adjacent species 118; and species being adjacent substrate-B 102. This can form a layered material 100 that has a graphene/species/substrate layered structure.

A non-limiting exemplary process that can be implemented to form an embodiment of the layered material 100 comprising a compressed composite will now be discussed. Using any of the growth techniques disclosure herein, a growth layer-A 106 can be formed on a substrate-A 102, forming layered material-A. Using any of the growth techniques disclosure herein, a growth layer-B 106 can be formed on a substrate-B 102, forming layered material-B. A species 118 can be positioned between growth layer-A 106 and growth layer-B 106. The species 118 can be metal (e.g., Ga, Li, Na, Ca, Mn, Fe, Pd, Pt, Au, Si, Ge, Sn, Pb, O, F, or any metal capable of being softened by heat and pressure—particularly metals with softening temperatures below 1000° C.), or a compound or alloy. If the metal is not "softened" then it will not thin down under pressure, and will not properly adhere to the growth layer 106. It should be noted that while metal species 118 are preferred, species 118 other than metal that can be confined by the growth layers 106. Layered material-A and layered material-B can be placed within a hot press platen so that heat (e.g., greater than 50 degrees Celsius) and pressure (greater than 1 atmosphere) can be applied to layered material-A, species 118, and layered material-B as they are caused to advance towards each other to generate a layered material heterostructure. For instance, the layered material 100 can include a compressed composite comprising: substrate-A 102 being adjacent growth layer-A 106; growth layer-A 106 being adjacent to species 118; species being adjacent growth layer-B 106; and growth layer-B 106 being adjacent substrate-B 102. This can form a layered material 100 that has a graphene/species/graphene layered structure. The growth layer-A and growth layer-B conformally coats the species 118, preventing oxidation of the species 118 and preserving the strong plasmonic or electronic resonant properties of the species/graphene interface. Species thickness may be controlled by tuning the applied pressure. The same or similar process can be used to generate the layered material 100 having a graphene/species/substrate layered structure.

As noted herein, embodiments of the layered material 100 and method of making and using the same can provide a layered material 100 with enhanced properties. These can include enhanced plasmonic or electronic resonant (providing the ability to use surface plasmons to provide desired optical properties, and in particular negative real permittivity) and/or energy transfer properties. Enhanced plasmonic or electronic resonant properties can facilitate the use of embodiments of the layered material 100 as part of a sensor system, for example. For instance, a light sensor can be generated in which an embodiment of the layered material 100 is used as the switch. As light is made to be incident upon the layered material 100, plasmons are produced in the interface layer 114 from the interaction of light with species-dielectric or intercalant-dielectric materials. The incident light couples with the plasmons to create self-sustaining, propagating electromagnetic waves (surface plasmon polaritons (SPPs)). Once launched, the SPPs ripple along the interface layer 114. The SSPs can be directed towards a detector, amplifier, analog-to-digital circuit, a processor, etc. to detected, record, and/or process the SSPs. Additional circuitry and methods can be used to detect, record, and process the intensity, wavelength, etc. of the SSPs. Use of embodiments of the layered material 100 in sensor systems can facilitate generation of a sensor with significantly improved sensitivity. For example, test results that will be discussed later for an embodiment of the layered material 100 demonstrate that embodiments of the layered material 100 can exhibit greater than a 20× improvement in second harmonic generation and greater than a 1,000× improvement in non-linear susceptibility compared to conventional sensor systems.

The enhanced plasmonic or electronic resonant properties exhibited by embodiments of the layered material 100 can provide excellent plasmon-enhanced sensing of biological or chemical materials (e.g., optical Raman sensing of biological and chemical molecules). For instance, Raman can be applied for use in testing and measuring analytes, including viruses and antibodies, where embodiments can assist in technologies to combat the spread of disease, harmful biological weapons, etc. Additionally, biosensing applications can include improvements in food safety technology. Other applications can include use in metamaterial sensing for information technology and optical sensing.

Samples of layered material were produced to test the enhanced Raman signature of biological and chemical molecules that can be achieved. Referring back to FIG. 4, the set of samples were generated via synthesis of epitaxial graphene (EG) on a SiC substrate, wherein defect engineering of the EG layers was performed to control elemental intercalation. Thermal evaporation of metallic elements onto the surface of EG layer at elevated temperatures was performed as part of the intercalation step. Synthesis of EG was performed at 500 Torr and 1800° C., using on-axis 6H—SiC wafers. Exposure of the SiC substrate to high temperatures led to Si sublimation from the SiC surface, and a subsequent 6√3×6√3)R30° reconstruction of carbon atoms. This reconstruction resulted in the formation of epitaxial carbon layers on top of SiC, which included the buffer layer. The buffer layer included carbon atoms, ⅓ of which were covalently bound to Si in the underlying SiC. As noted herein, this partially covalently bound interface was able to be passivated by various intercalating species, due to the fact that ⅔ of the interface consisted of high-energy dangling Si-bonds. It should be noted that the buffer layer may be referred to as 0 L EG, and 1 graphene layer+buffer layer may be referred to as 1 L EG.

Following EG synthesis, the EG was exposed to a plasma (such as $O_2$/He, $N_2/H_2$, $CF_4$/He) to create defects in the in the EG layers. Following plasma exposure, the EG samples were placed in an alumina crucible facing-downward over 30-40 mg of metallic Ga, In, or Sn. The crucible was then placed in a 25 mm diameter tube furnace, which was evacuated to ~10 mTorr and subsequently pressurized to 300 Torr with 50 sccm Argon. The furnace was then heated to 600-1100° C. and held at temperature for 30 minutes. The furnace was naturally cooled to room temperature, and the crucible was removed. The use of metallic gallium, indium, and tin precursors facilitated the realization of 2-D layers located between SiC and EG.

Figure 9:
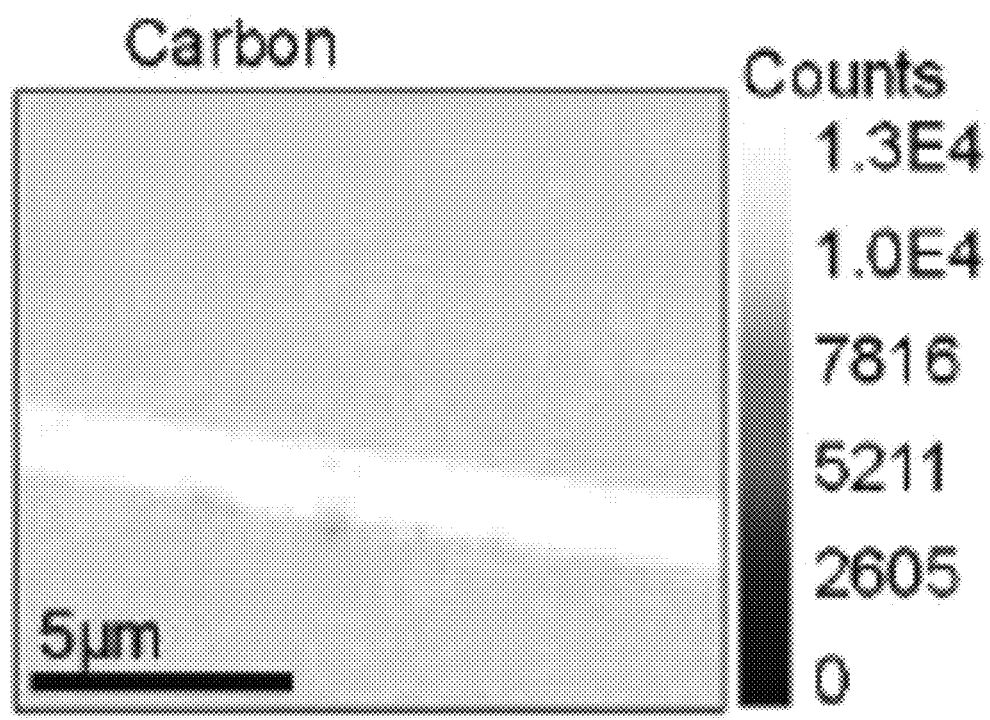
FIG. 9 shows an exemplary Auger electron spectroscopy map of carbon signals across the surface of an embodiment of the layered material of FIG. 3, where the diagonal line feature corresponds to a step-edge on the material where graphene (Gr) is thick.
Figure 10:
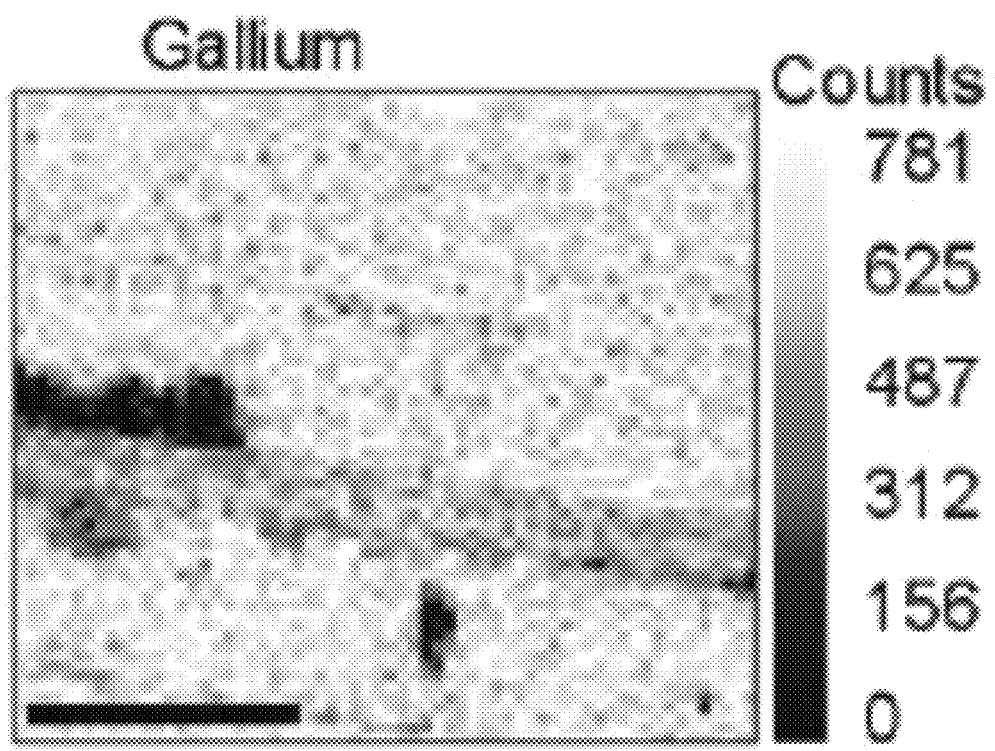
FIG. 10 shows an exemplary Auger electron spectroscopy map of gallium signals across the surface of an embodiment of the layered material of FIG. 3, where the diagonal line feature corresponds to a step-edge on the material where graphene is thick.
Figure 11:
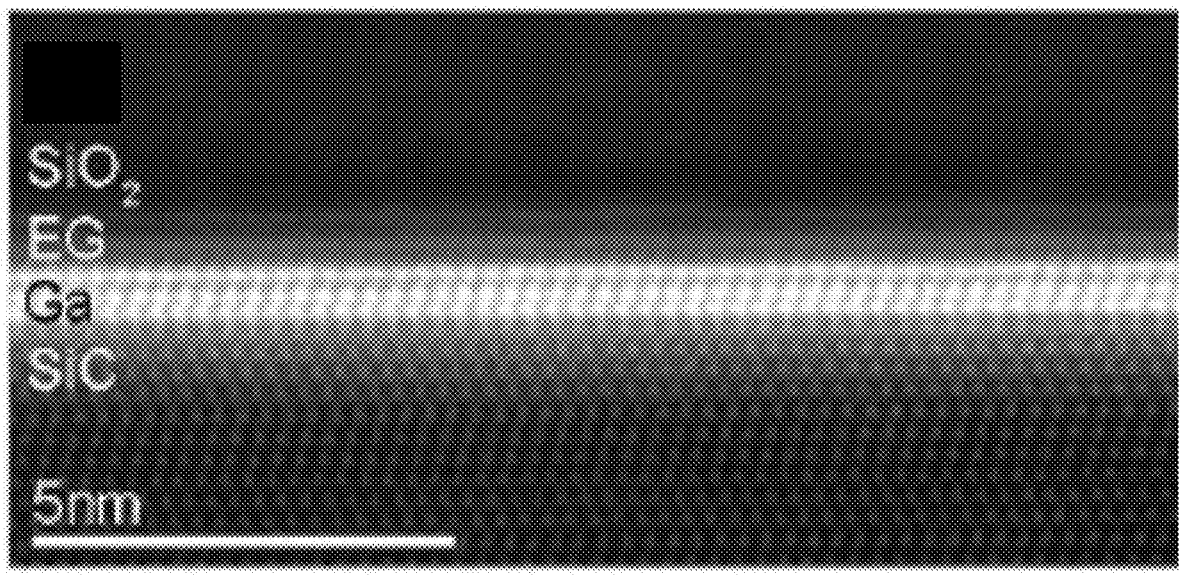
FIG. 11 shows scanning transmission electron microscopy (STEM) imagery of an exemplary embodiment of the layered material of FIG. 3 in which gallium (Ga) is used as the intercalant.
Figure 12:
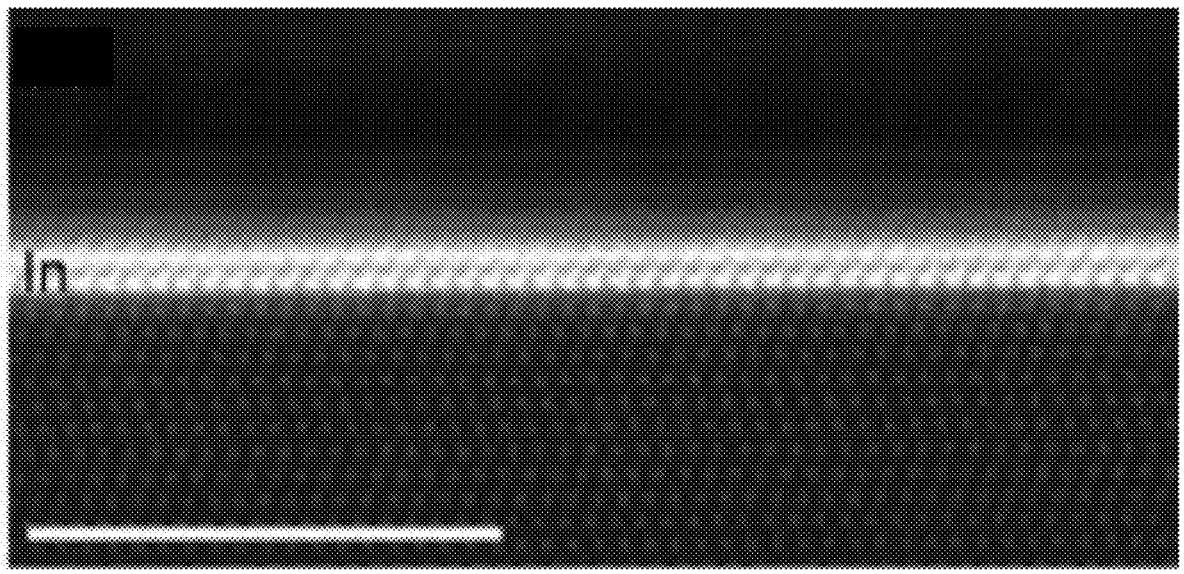
FIG. 12 shows STEM imagery of an exemplary embodiment of the layered material of FIG. 3 in which indium (In) is used as the intercalant.
Figure 13:
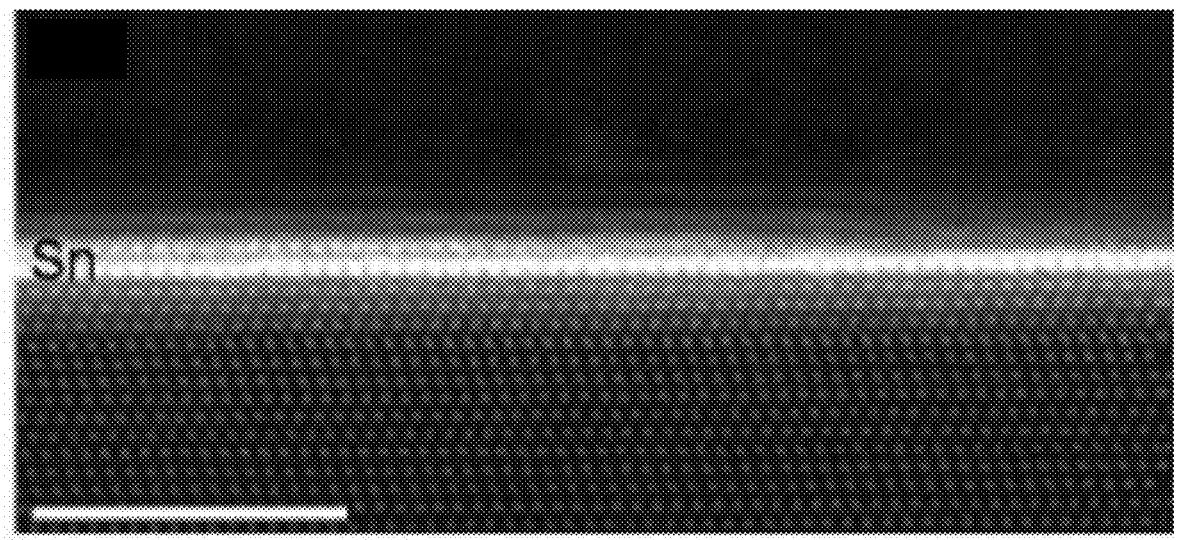
FIG. 13 shows STEM imagery of an exemplary embodiment of the layered material of FIG. 3 in which tin (Sn) is used as the intercalant.
Figure 14:
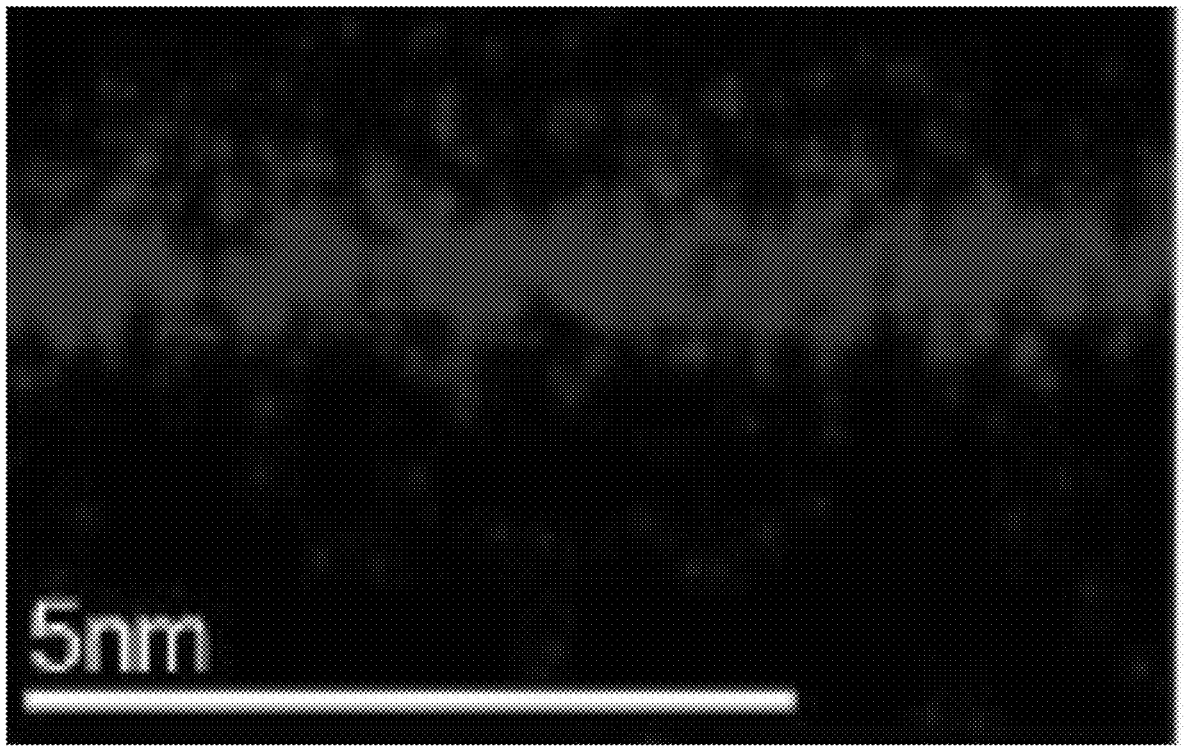
FIG. 14 shows the gallium signal recorded by energy dispersive x-ray spectroscopy for an exemplary embodiment of the layered material of FIG. 3 in which gallium is used as the intercalant, as shown in FIG. 11.
Figure 15:
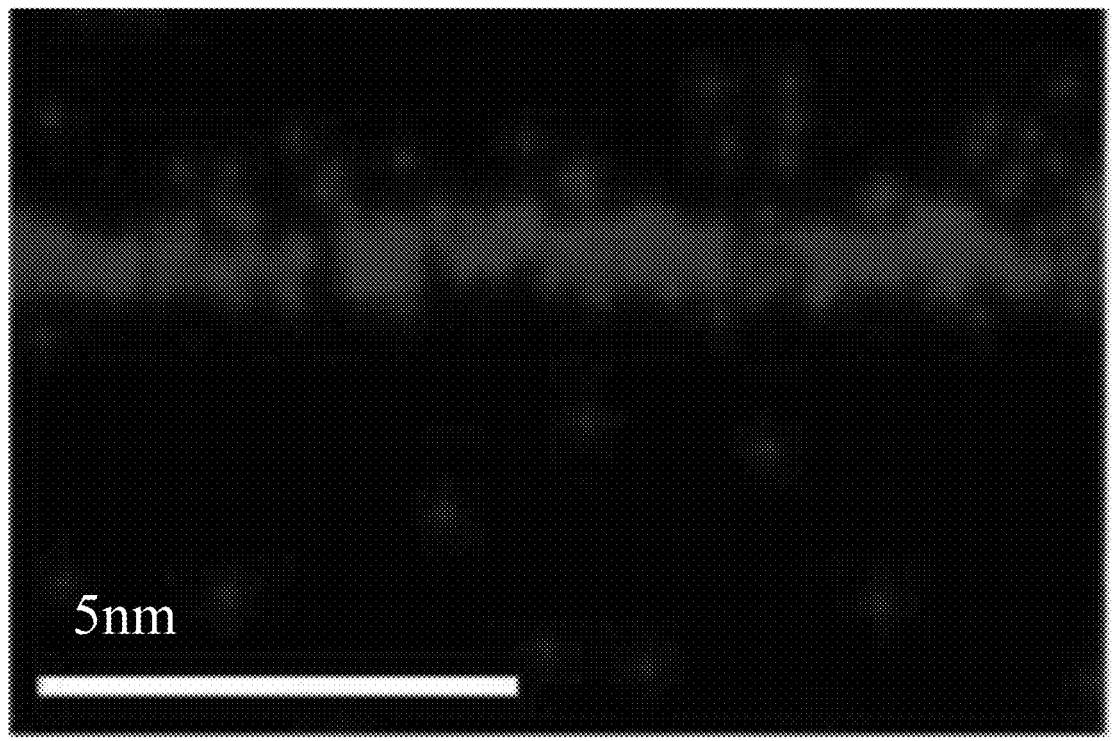
FIG. 15 shows the indium signal recorded by energy dispersive x-ray spectroscopy for an exemplary embodiment of the layered material of FIG. 3 in which indium is used as the intercalant, as shown in FIG. 12.
Figure 16:
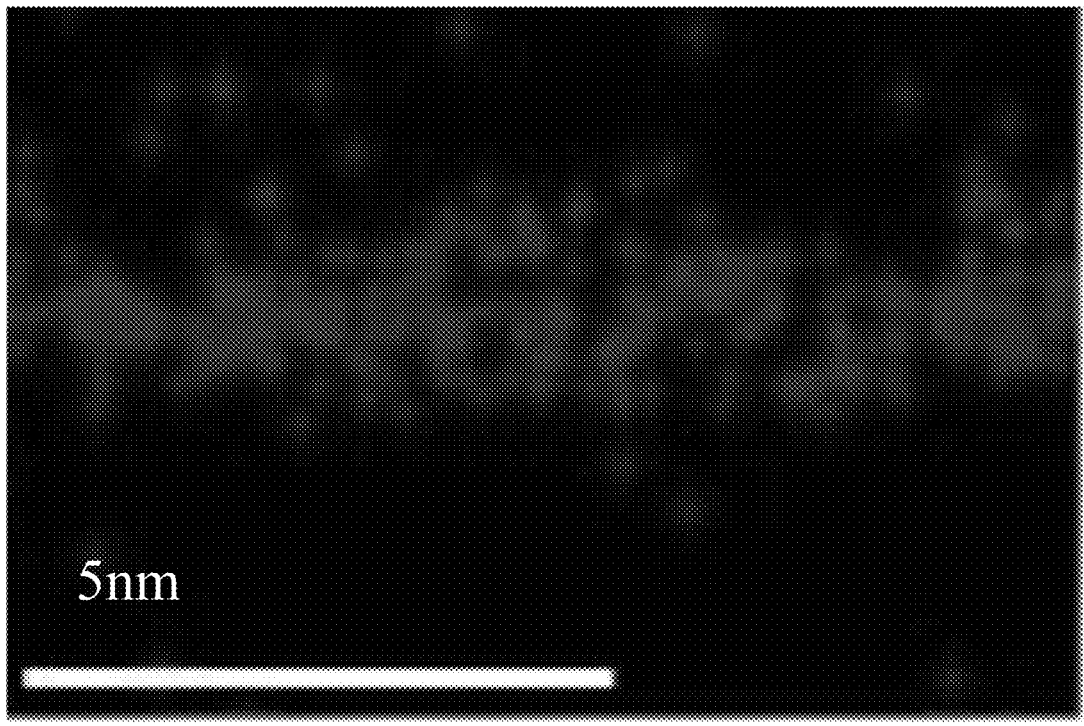
FIG. 16 shows the tin signal recorded by energy dispersive x-ray spectroscopy for an exemplary embodiment of the layered material of FIG. 3 in which tin is used as the intercalant, as shown in FIG. 13.
Figure 17:
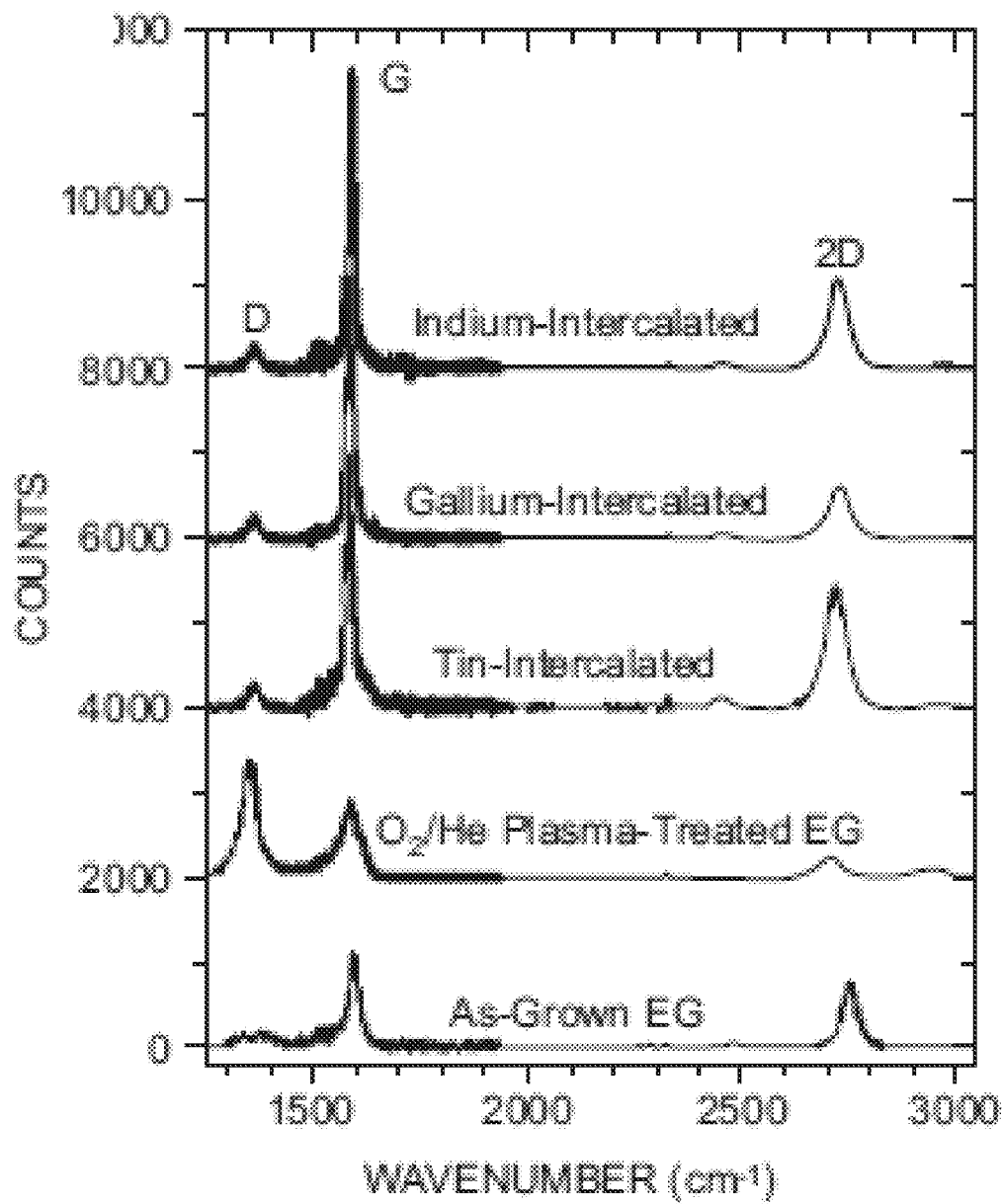
FIG. 17 shows a Raman signature for exemplary embodiments that includes epitaxial grown graphene, $O_2$/He plasma-treated epitaxial grown graphene, and intercalated epitaxial grown graphene, where gallium, indium, and tin are intercalants used, and the SiC background spectra have been subtracted

FIGS. 9-10 show Auger electron spectroscopy (AES) mapping of the surface of a Ga-intercalated EG sample, showing that both C and Ga signal are present across large areas of the sample. Imaging cross sections of such samples via scanning-tunneling electron microscopy (STEM) shows atomic layers located between SiC and EG (see FIGS. 11-13). Furthermore, the metallic composition of intercalated layers is confirmed through energy dispersive spectroscopy (see FIGS. 14-16). Different numbers of atomic layers can be seen for each intercalant. These layer numbers are believed to be energetically favorable at the EG/SiC interface, where computational calculations regarding the preferred layer-number of each intercalant are consistent with experimental observations. FIG. 17 shows the Raman signature for as-grown EG, $O_2$/He plasma-treated EG, and intercalated EG. Observation of these spectra shows that plasma treating EG layers results in a significant increase in D:G ratio, suggesting the formation of highly-defective graphene layers. However, this D:G ratio decreases significantly following the intercalation process. Additionally, the D and 2D peak positions shifts as a result of intercalation. Shifting of these peaks could be attributed to a reduction of strain in graphene layers resulting from the presence of intercalant atoms and elimination of bonding between the SiC and buffer layer EG. While the exact cause for reduction in D:G ratio is not clear, one possible reason could be that the graphene 'heals' during the intercalation process. It is also possible that intercalant layers facilitate Raman enhancement via charge transfer between intercalants and graphene, and/or plasmonic or electronic resonant resonance of the intercalant layer.

Figure 18:
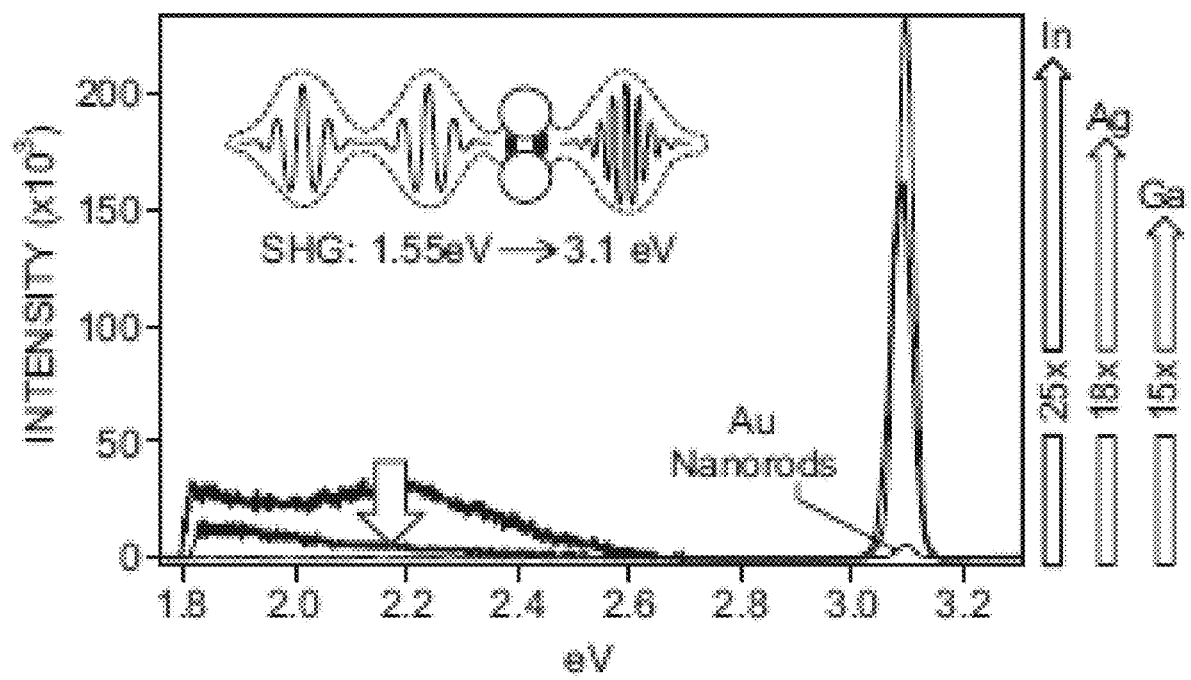
FIG. 18 shows second harmonic generation spectra for exemplary embodiments configured as 2D-In/Gr, 2D-Silver (Ag)/Gr, 2D-Ga/Gr nanorods as well as gold (Au) nanorods.
Figure 19:
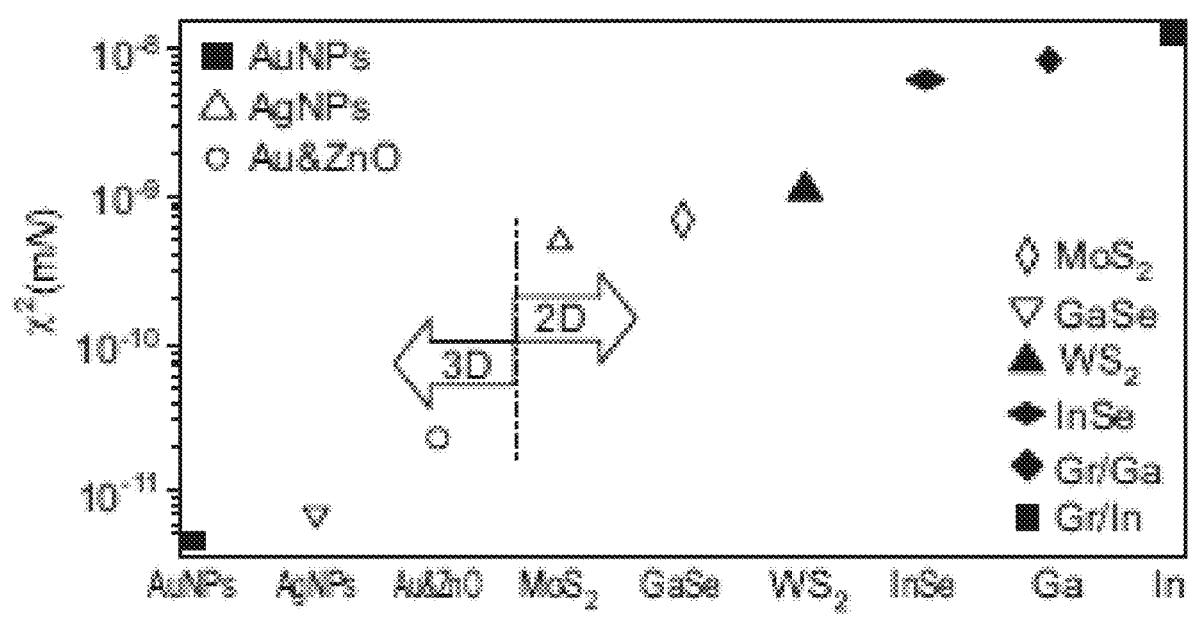
FIG. 19 shows a comparison of $\chi 2$ values for different 2D and 3D materials.

Embodiments of the inventive layered material may be referred to herein as a 2D metal/graphene (2D-M/Gr) hybrid structures or 2D-M/Gr hybrid systems. In such a notation of 2D-M/Gr, the "M" is a metal and the "2D" refers to the layer being a 2D layer that is within a range from one atom thick to ten atoms thick, one molecule thick to ten molecules thick, or one ion thick to ten ions thick. While these studies show the presence of 2-D metal layers between epitaxial graphene (EG) and SiC, further studies reveal unique properties of these 2D metal/graphene (2D-M/Gr) hybrid structures. Specifically, the second harmonic generation (SHG) intensity of the 2D-M/Gr hybrid systems is 15-25× greater than that of Au nanorods—the current state-of-the-art plasmonic or electronic resonant material (See FIGS. 18-19). SHG measurements were taken using an incident energy of 1.55 eV, where the sample was oriented normal to the incident beam. Additionally, the feature observed at ~2.2 eV for Au nanorods is not present in 2D-M/Gr systems. Calculations show that the nonlinear susceptibility ($\chi^2$) values for 2D-M/Gr hybrid system structures are over 1000× that of Au nanorods, and are also greater than values recently reported for van der Waals 2-dimensional materials such as $WS_2$ and InSe (see FIG. 19).

Test data reveal that plasmon coherence times in 2D-M/Gr hybrid systems is also twice as long as that of Au and Au nanorods. These results indicate that 2D-M/Gr hybrid systems make excellent candidates for plasmonic or electronic resonant sensing platforms, offering extraordinary improvements in sensitivity. Furthermore, the presence of graphene capping layers ensures that 2D metal layers are protected from environmental effects such as oxidation, making these structures robust.

Figure 20:
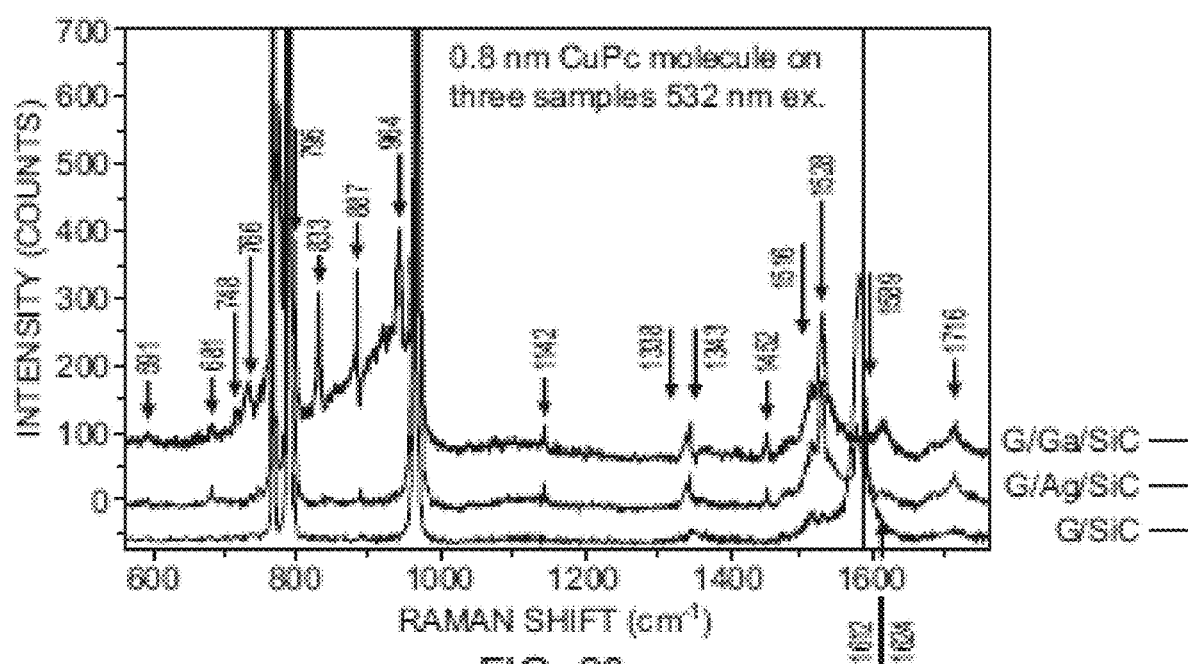
FIG. 20 is a Raman spectra of an exemplary embodiment in which Copper(II) phthalocyanine is deposited on a graphene/SiC substrate and on intercalated graphene/SiC with 2D-gallium and silver.
Figure 21:
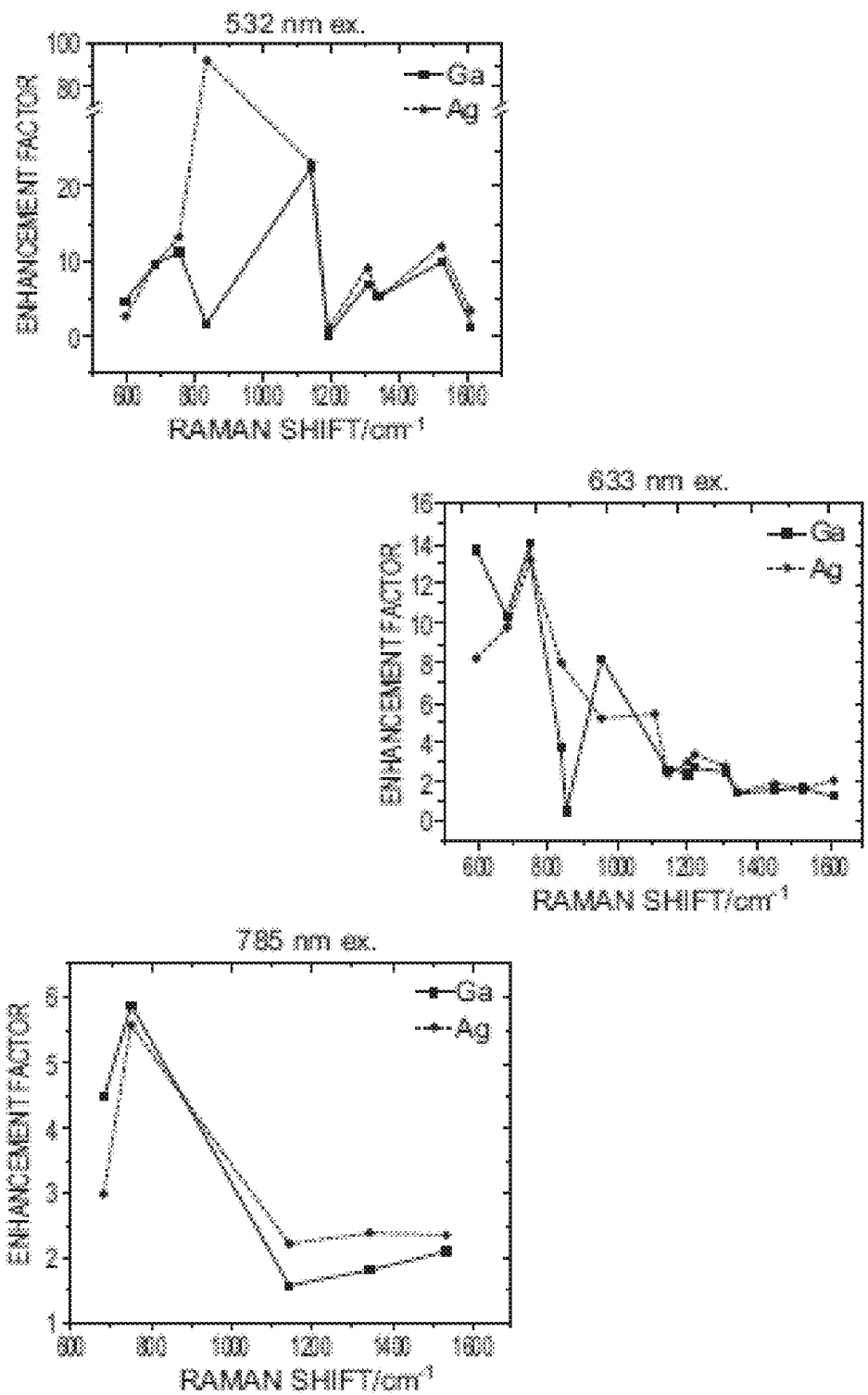
FIG. 21 illustrates Raman spectra intensity peaks for the exemplary system of FIG. 20 for excitation wavelengths at 532 nm, 633 nm, and 785 nm.

As it is contemplated for the enhanced plasmonic or electronic resonant properties to allow the 2D-M/Gr hybrid systems to be used for plasmon-enhanced sensing of biological materials, optical (e.g. Raman) sensing of biological and chemical molecules was performed with embodiments of the 2D-M/Gr hybrid system, wherein copper(II) phthalocyanine (CuPC) was used as a test molecule. A significant enhancement in Raman signature for samples of the 2D-M/Gr hybrid system (as compared to graphene alone) was experienced, verifying that embodiments of the 2D-M/Gr hybrid system used as a sensor can lead to dramatic improvements in sensing ability. FIG. 20 demonstrates the Raman enhancement of CuPC for 2D-Ga and Ag compared to graphene alone. The Enhancement Factor [(EF)=IG/Ga/IG or IG/Ag/IG], where I is the intensity of the identified peaks in FIG. 20, for each peak is noted in FIG. 21 as a function of laser wavelength. As noted, some of the enhancements can be as large as 100×.

Figure 22:
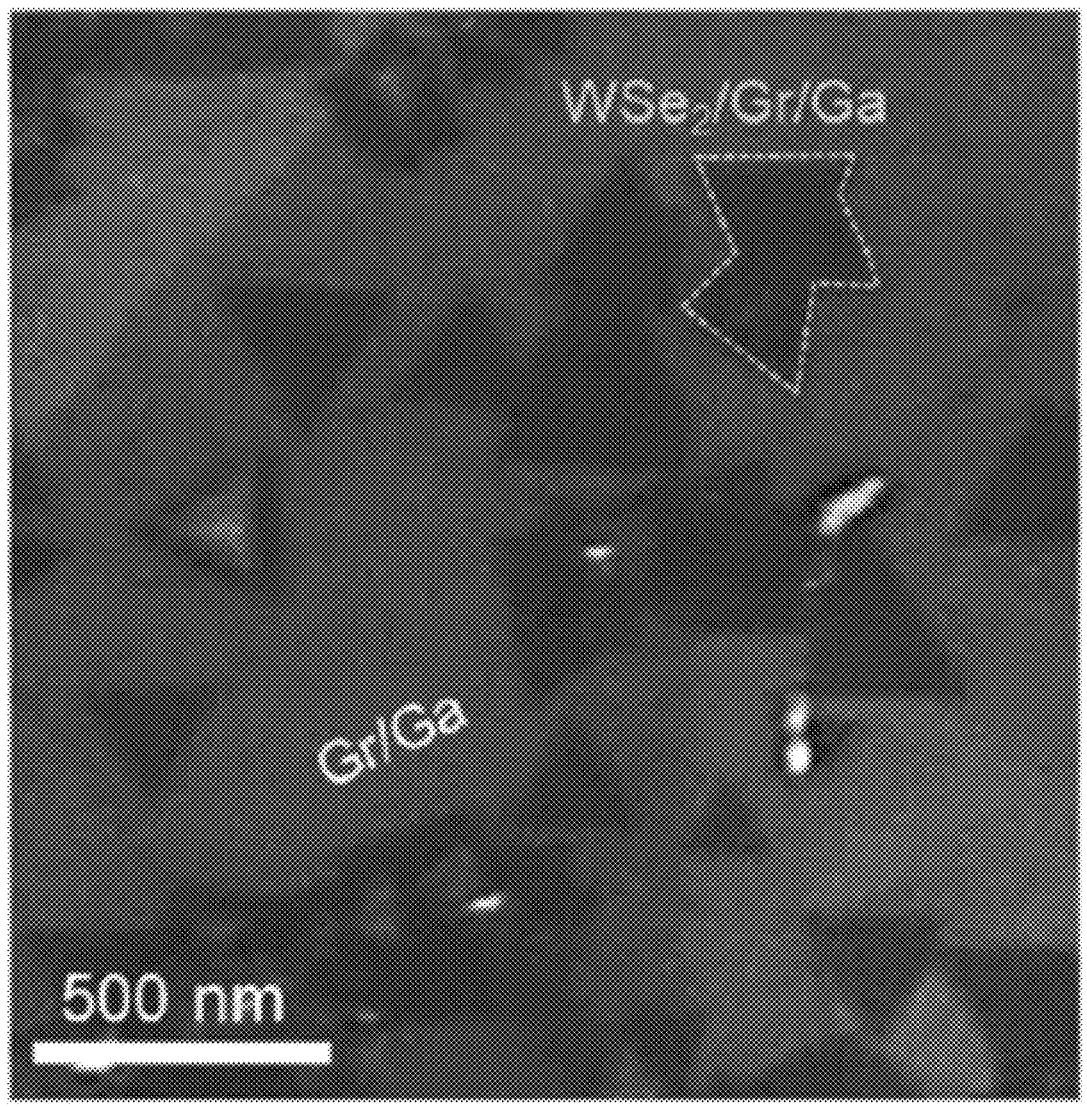
FIG. 22 is a scanning electron microscope image of domains for an exemplary embodiment that includes a 2-D Tungsten diselenide (WSe2) later formed on top of an exemplary graphene growth layer to form an exemplary embodiment of the layered material.
Figure 23:
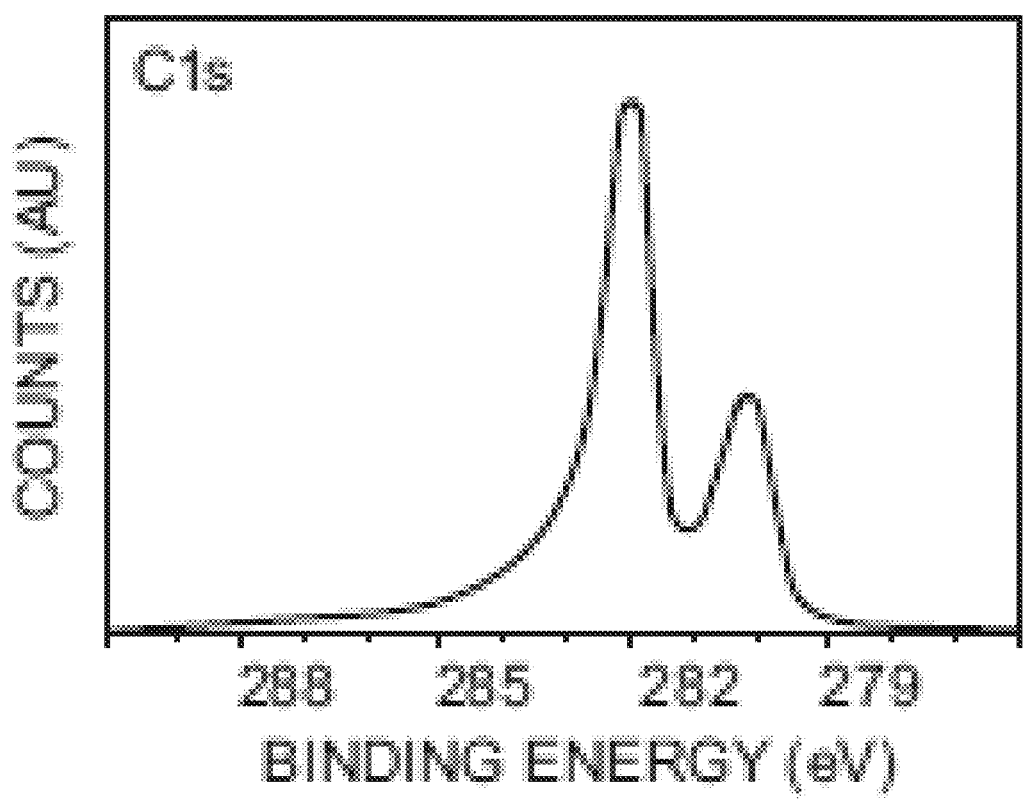
FIG. 23 illustrates an x-ray photoelectron spectroscopy spectra for the exemplary system of FIG. 22, showing C 1s spectra.
Figure 24:
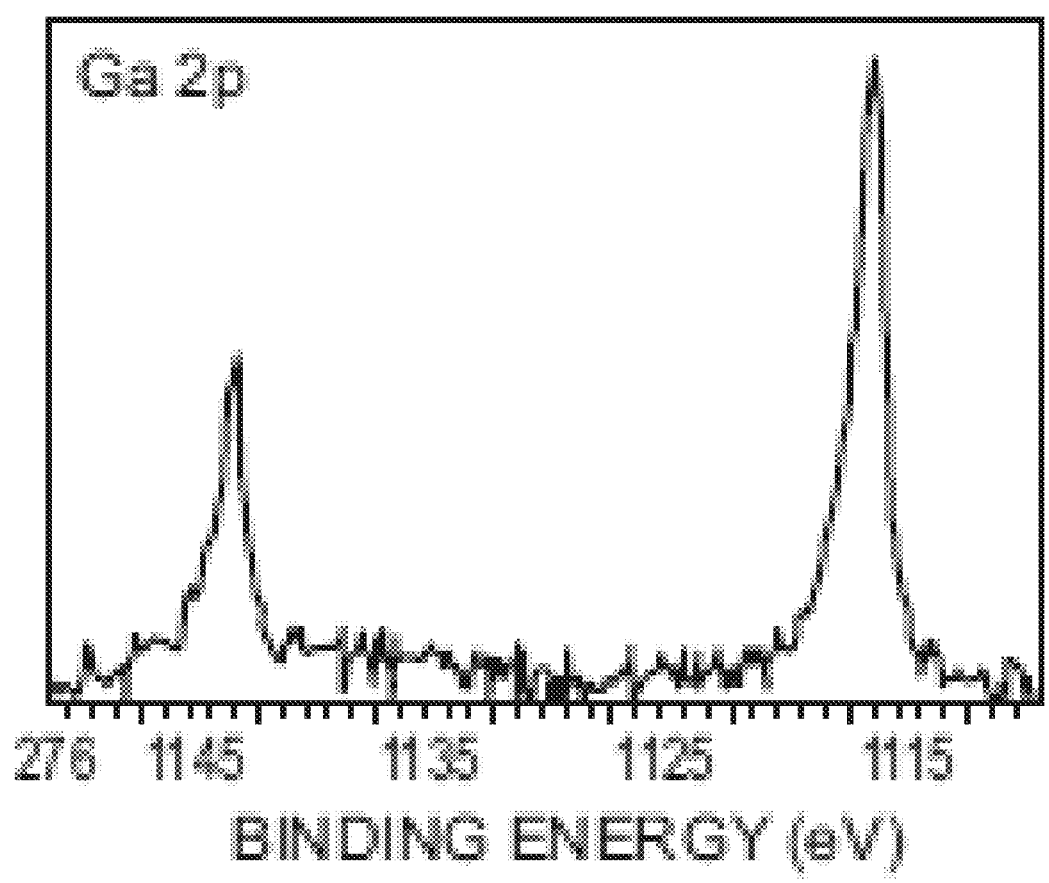
FIG. 24 illustrates an x-ray photoelectron spectroscopy spectra for the exemplary system of FIG. 22, showing Ga 2p spectra.
Figure 25:
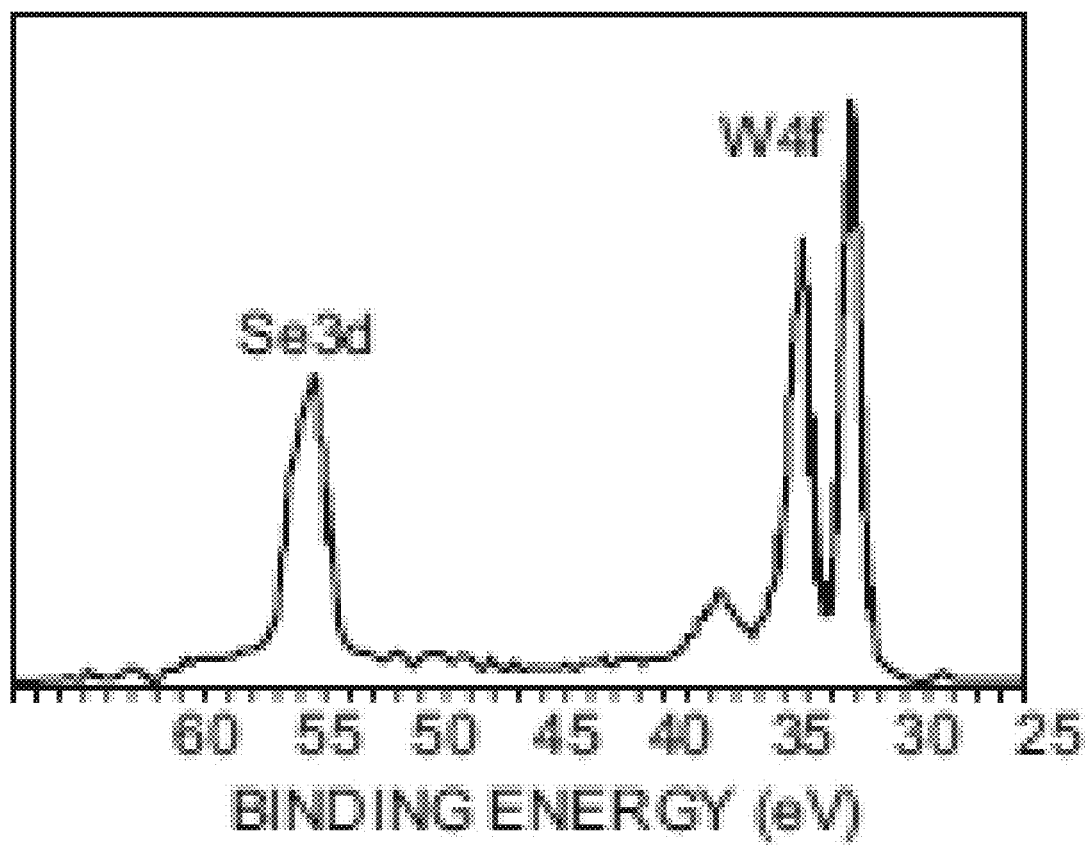
FIG. 25 illustrates an x-ray photoelectron spectroscopy spectra for the exemplary system of FIG. 22, showing Se 3d and W 4f spectra.

Given the promising plasmonic, electronically resonant and sensing properties of 2D-M/Gr hybrid system, further advanced technology can be realized based on the 2D-M/Gr hybrid structures. Specifically, the fabrication of transition metal dichalcogenide (TMD)+2D-M/Gr hybrid heterostructures could enable the creation of new plasmonic/excitonic systems in which strong coupling between 2D excitons in the TMD and 2D plasmons in the 2D-M/Gr hybrid can improve efficiency and interfacial energy transfer. In this regard, samples were produced in which 2D WSe2 layers were directly grown on 2D-M/Gr hybrids (see FIG. 6). Growth of WSe2 layers was achieved through metal organic chemical vapor deposition (MOCVD) performed at 600° C. using W(CO)6 and H2Se as metal and chalcogen sources. FIG. 6 shows a schematic of the heterostructure synthesis process, and FIG. 22 shows domains of 2D WSe2 on top of a 2D-Ga/Gr hybrid system. As seen in FIGS. 22-25, investigation of the sample chemistry after WSe2 growth via x-ray photoelectron spectroscopy (XPS) shows that C and Ga signals persist after WSe2 growth, indicating that the growth process is nondestructive toward the Ga/Gr structure. Furthermore, W and Se signal is consistent with standard, grown—WSe2 layers.

The development of this synthesis process has enabled further study and development of advanced plasmonic or electronic resonant material systems. Not only does this work demonstrate a robust, facile route to realizing 2D-M/Gr hybrid systems, but it reveals the promise of such materials for technological applications. 2D-M/Gr hybrid structures alone exhibit promise as plasmonic or electronic resonant platforms. Beyond this, other 2-D and layered materials may be simply grown on top of 2D-M/Gr hybrids to create advanced heterostructures. The successful demonstration of TMD/2D-M/Gr heterostructure fabrication suggests that this approach may be used to realize a wide range of structures, where the 2D-M and MOCVD-grown layers may be chosen based on a desired property or outcome.

Embodiments disclosed herein demonstrate that intercalation of these systems can be done to successfully intercalant three different metals, though many more intercalants are possible. Furthermore, current knowledge of synthesis of TMDs beyond WSe2 may be directly applied to the creation of TMD/2D-M/Gr heterostructures. The development of these robust, repeatable methods of realizing 2D-M/Gr and related structures, coupled with outstanding plasmonic or electronic resonant performance has revealed an extremely promising platform for next generation materials and technologies.

Figure 26:
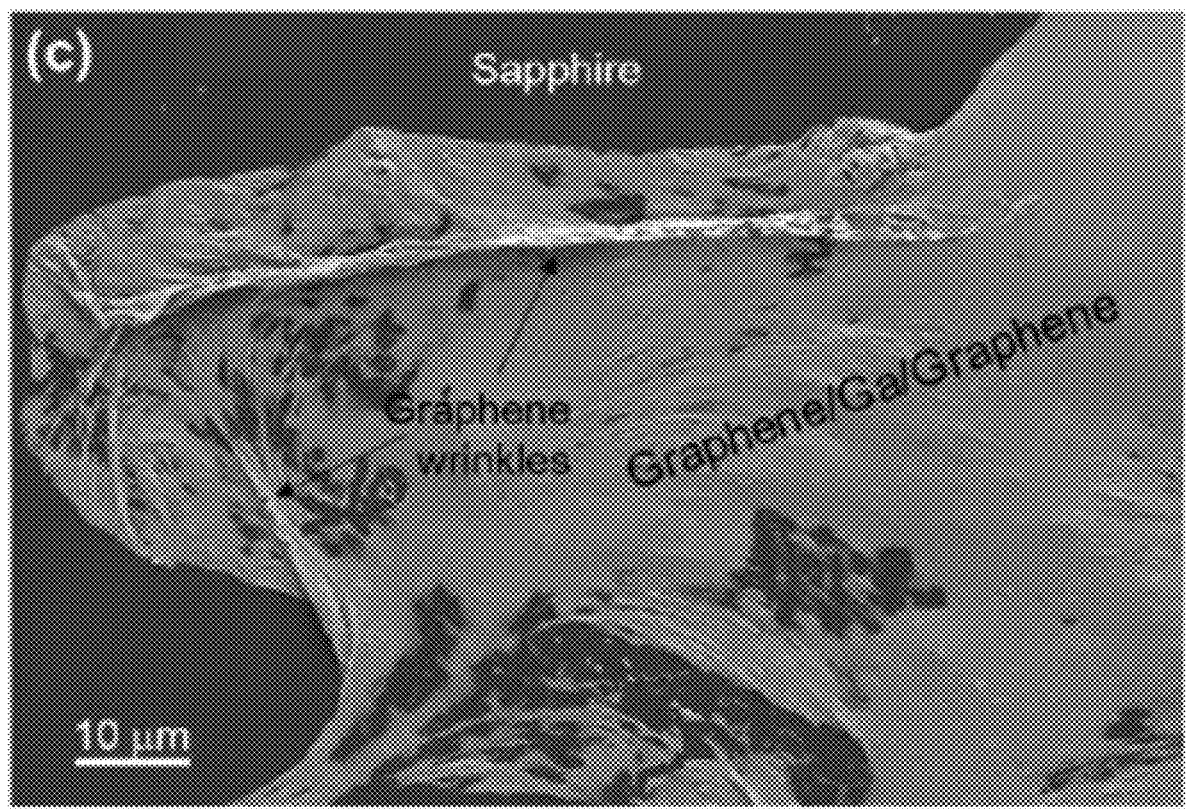
FIG. 26 shows an exemplary scanning electron microscope image of an edge of a graphene/gallium/graphene (Gr/Ga/Gr) structure.

Referring back to FIGS. 7-8, in addition to confinement heteroepitaxy to form heterostructures, ultra-thin (<10 nm) graphene/metal hybrids can be generated. Samples in which confinement of metals between two layers of graphene supported by a rigid substrate or one layer of graphene and a rigid substrate were produced. FIGS. 7-8 illustrate two possible configurations that utilize a rigid substrate coated with graphene to compress and encapsulate a metal layer (e.g. Ga) and create the graphene/metal hybrid. The resulting structures are either Graphene/Metal/Graphene or Graphene/Metal/Substrate. The top layer of graphene is can be beneficial to ensure no oxidation of the metal will occur, thereby preserving the strong plasmonic or electronic resonant properties of the metal/graphene interface. FIG. 26 is an SEM micrograph of the edge of a graphene/gallium/graphene (Gr/Ga/Gr) structure. The graphene conformally coats the gallium metal, preventing oxidation of the underlying gallium. This process is applicable to any metal capable of being softened by heat and pressure, e.g. all metals with a melting temperature below 1000° C. Metal thickness was controlled by tuning the applied pressure.

Embodiments of the plasmonic or electronic resonant material can be incorporated into systems, sensors, or other mechanisms. For example, embodiments of the plasmonic or electronic resonant material can be used as a sensor or detector in a Raman spectrometer. In a basic operational set up, a Raman spectrometer can include a laser, a filter, and a detector. In operation, the laser emits light so as to be incident upon a sample (e.g., a biological or chemical sample), wherein the light interacts (via inelastic or Raman scattering) with molecular vibrations, phonons or other excitations in the sample. The resulting interactions cause the energy of the laser photons to be shifted up or down. The shift in energy provides information about the vibrational modes in the sample. The electromagnetic radiation emitted from the sample due to the interactions can be directed though a filter (e.g., a monochromator) and be further directed to a sensor. The sensor can be made from an embodiment of the layered material configured as a plasmonic or electronic resonant material. Plasmons can be generated in the interface layer 114 when the electromagnetic radiation emitted from the sample is incident upon the plasmonic or electronic resonant material. For instance, the electromagnetic radiation emitted from the sample can couple with the plasmons to form surface plasmon polaritons (SPPs), which can be subsequently detected by a detector.

In one embodiment, an embodiment of the layered material can be used as a surface on which molecules of a sample are deposited. The laser light can be used to excite the molecules, wherein molecular vibration is enhanced due to coupling with the layered material surface at which the molecule are placed on. This configuration can cause the electromagnetic radiation emitted from the sample to be enhanced via the adjacent layered material surface.

For instance, a Raman spectrometer can be utilized, where a light source is used to generate light that will be incident upon a sample. The Raman spectrometer can include a detector configured to detect electromagnetic radiation generated by the sample. The Raman spectrometer can include a plasmonic or electronically resonant material upon which the sample is placed. The plasmonic or electronically resonant material can include a substrate; an epitaxial growth layer, comprising a graphene layer; and an interface layer formed between the graphene layer and the substrate, the interface layer comprising pristine graphene passivated with intercalant. When the laser light interacts with the sample, molecules of the sample are excited so that molecular vibrations are generated. Plasmons are generated in the interface layer when the molecular vibrations occur. The molecular vibrations couple with the plasmons to enhance the electromagnetic radiation emitted from the sample.

It should be understood that the disclosure of a range of values is a disclosure of every numerical value within that range, including the end points. It should also be appreciated that some components, features, and/or configurations may be described in connection with only one particular embodiment, but these same components, features, and/or configurations can be applied or used with many other embodiments and should be considered applicable to the other embodiments, unless stated otherwise or unless such a component, feature, and/or configuration is technically impossible to use with the other embodiment. Thus, the components, features, and/or configurations of the various embodiments can be combined together in any manner and such combinations are expressly contemplated and disclosed by this statement.

It will be apparent to those skilled in the art that numerous modifications and variations of the described examples and embodiments are possible considering the above teachings of the disclosure. The disclosed examples and embodiments are presented for purposes of illustration only. Other alternate embodiments may include some or all of the features disclosed herein. Therefore, it is the intent to cover all such modifications and alternate embodiments as may come within the true scope of this invention, which is to be given the full breadth thereof.

It should be understood that modifications to the embodiments disclosed herein can be made to meet a particular set of design criteria. For instance, any of the substrate formation processes, growth layer processes, intercalation processes, layered configurations, or any other component or operating parameter can be any suitable number or type of each to meet a particular objective. Therefore, while certain exemplary embodiments of the system and methods of using and making the same disclosed herein have been discussed and illustrated, it is to be distinctly understood that the invention is not limited thereto but may be otherwise variously embodied and practiced within the scope of the following claims.

What is claimed is:

1. A plasmonic or electronically resonant material, comprising:
    a substrate; and
    a plurality of epitaxial growth layers formed on the substrate, the plurality of epitaxial growth layers comprising:
        a buffer layer adjacent the substrate, the buffer layer being an electrically inactive layer, the buffer layer being partially bonded via covalent bonding to the substrate; and
        a growth layer adjacent the buffer layer, the growth layer including a plurality of defects, the growth layer being an electrically active layer; and
    an interface layer formed between the plurality of epitaxial growth layers and the substrate, the interface layer comprising graphene passivated with intercalant, wherein the intercalate physically and electronically decouples the buffer layer from the substrate.

2. The plasmonic or electronically resonant material recited in claim 1, wherein at least one epitaxial growth layer of the plurality of epitaxial growth layers includes a graphene layer comprising a plurality of pristine graphene layers.

3. The plasmonic or electronically resonant material recited in claim 1, wherein the substrate is silicon carbide.

4. The plasmonic or electronically resonant material recited in claim 1, wherein the intercalant is metal.

5. The plasmonic or electronically resonant material recited in claim 1, wherein the intercalant comprises any one or combination of europium, hydrogen, silicon, gallium, indium, lithium, sodium, calcium, iron, palladium, platinum, gold, silver, germanium, tin, lead, oxygen, and fluorine.

6. The plasmonic or electronically resonant material recited in claim 1, further comprising at least one vapor deposition growth layer formed on top of the graphene layer.

7. The plasmonic or electronically resonant material recited in claim 6, wherein the at least one vapor deposition growth layer is a transition metal dichalcogenide layer.

8. A method for forming a plasmonic or electronically resonant material, the method comprising:
    generating a plurality of epitaxial growth layers on a substrate, the plurality of epitaxial growth layers comprising:
        a buffer layer adjacent the substrate, the buffer layer being an electrically inactive layer, the buffer layer being partially bonded via covalent bonding to the substrate;
        a growth layer adjacent the buffer layer, the growth layer being an electrically active layer;
    generating the plurality of defects in the growth layer; and
    intercalating the buffer layer with intercalant by allowing the intercalant to migrate through a plurality of defects in the growth layer and into the buffer layer, wherein the intercalate physically and electronically decouples the buffer layer from the substrate.

9. A method for forming a plasmonic or electronically resonant material, the method comprising:
    generating an epitaxial growth layer on a substrate, the epitaxial growth layer comprising a buffer layer adjacent the substrate, the buffer layer being an electrically inactive layer, the buffer layer being partially bonded via covalent bonding to the substrate, wherein generating the epitaxial growth layer comprises sublimation; and
    intercalating the buffer layer with intercalant to physically and electronically decouple the buffer layer from the substrate, wherein intercalation comprises thermal evaporation.

10. The method recited in claim 8, wherein:
    the substrate is silicon carbide, and generating the plurality of epitaxial growth layers comprises silicon sublimation; and
    the plurality of epitaxial growth layers comprises graphene.

11. The method recited in claim 9, wherein:
    the substrate is silicon carbide, and generating the epitaxial growth layer comprises silicon sublimation; and
    the epitaxial growth layer comprises graphene.

12. The method recited in claim 8, wherein:
    generating the plurality of epitaxial growth layers comprises sublimation;
    generating the plurality of defects in the growth layer comprises masking and implantation; and
    intercalation comprises thermal evaporation.

* * * * *